(12) United States Patent
Busman et al.

(10) Patent No.: US 9,889,461 B2
(45) Date of Patent: Feb. 13, 2018

(54) DISPLAY PANEL SUBSTRATE ASSEMBLY AND AN APPARATUS AND METHOD FOR FORMING A DISPLAY PANEL SUBSTRATE ASSEMBLY

(75) Inventors: Stanley C. Busman, North St. Paul, MN (US); Chin Teong Ong, Singapore (SG); Yi Lin Sim, Singapore (SG); Wee Hock Chan, Singapore (SG); Xinhe Chen, Singapore (SG); Meng Sheng Toy, Singapore (SG)

(73) Assignees: 3M INNOVATIVE PROPERTIES COMPANY, St. Paul, MN (US); TRIMECH TECHNOLOGY PTE. LTD, Tampines (SG)

( * ) Notice: Subject to any disclaimer, the term of this patent is extended or adjusted under 35 U.S.C. 154(b) by 1008 days.

(21) Appl. No.: 13/821,590

(22) PCT Filed: Sep. 9, 2011

(86) PCT No.: PCT/US2011/050964
§ 371 (c)(1),
(2), (4) Date: Jul. 30, 2013

(87) PCT Pub. No.: WO2012/036980
PCT Pub. Date: Mar. 22, 2012

(65) Prior Publication Data
US 2013/0295337 A1 Nov. 7, 2013

(30) Foreign Application Priority Data

Sep. 13, 2010 (SG) .................................. 201006623

(51) Int. Cl.
*B05B 15/04* (2006.01)
*G02F 1/13* (2006.01)
(Continued)

(52) U.S. Cl.
CPC ............ *B05B 15/04* (2013.01); *G02F 1/1303* (2013.01); *G02F 1/1339* (2013.01); *H05K 5/02* (2013.01);
(Continued)

(58) Field of Classification Search
CPC .. H05K 5/02; H05K 13/00; H05K 2203/0522; G02F 1/1303; G02F 1/1339;
(Continued)

(56) References Cited

U.S. PATENT DOCUMENTS 5,359,928 A * 11/1994 Blessington ............ B41C 1/142
101/128.4
6,361,389 B1 * 3/2002 Hogue .............. B32B 17/10302
349/187

(Continued)

OTHER PUBLICATIONS

International Search Report, dated Apr. 12, 2012, from corresponding PCT application.

*Primary Examiner* — Christopher Schatz
(74) *Attorney, Agent, or Firm* — Young & Thompson

(57) ABSTRACT

The present invention discloses a display panel substrate assembly and an apparatus and method for forming a display panel substrate assembly, wherein the substrate assembly includes a first substrate and a second substrate. At least one of the first substrate and the second substrate is optically clear. The method includes the steps of screen printing a non-sag adhesive composition onto a surface of the first substrate, bringing the non-sag adhesive composition into contact with a surface of the second substrate in an environment having a pressure of less than or equal to about 5000 pascals, and curing the non-sag adhesive composition to yield an adhesive layer. The non-sag adhesive composition is of a type which is optically clear after curing.

5 Claims, 9 Drawing Sheets

(51) Int. Cl.
  *G02F 1/1339* (2006.01)
  *H05K 5/02* (2006.01)
  *H05K 13/00* (2006.01)

(52) U.S. Cl.
  CPC ......... *H05K 13/00* (2013.01); *G02F 2202/28* (2013.01); *Y10T 428/24628* (2015.01); *Y10T 428/24868* (2015.01)

(58) Field of Classification Search
  CPC ......... G02F 2202/28; Y10T 428/24628; Y10T 428/24868; B32B 2305/55; B32B 2309/12; B32B 2457/20; B32B 2457/202; B32B 2457/204; B32B 2457/206; B32B 2457/208; B32B 37/12; B32B 2037/1292; B32B 7/12; B32G 2037/1253; C23C 14/042; C23C 18/06; C23C 14/02; C23C 14/04; G03F 7/115; B05B 15/04
  See application file for complete search history.

(56) References Cited

U.S. PATENT DOCUMENTS

| | | |
|---|---|---|
| 2003/0145943 A1 | 8/2003 | Lee et al. |
| 2004/0090429 A1 | 5/2004 | Geaghan et al. |
| 2004/0095546 A1* | 5/2004 | Lee .................. B29C 65/7852 349/187 |
| 2004/0238491 A1* | 12/2004 | Berasi .................. B81C 99/009 216/83 |
| 2005/0155704 A1 | 7/2005 | Yokajty et al. |
| 2006/0008665 A1 | 1/2006 | Kotsubo et al. |
| 2007/0125495 A1* | 6/2007 | Nakamura .......... B32B 38/1841 156/382 |
| 2010/0148160 A1* | 6/2010 | Cao .................. H01L 51/5246 257/40 |
| 2011/0192525 A1* | 8/2011 | Kondo .................. B30B 5/02 156/99 |

\* cited by examiner

DISPLAY PANEL SUBSTRATE ASSEMBLY AND AN APPARATUS AND METHOD FOR FORMING A DISPLAY PANEL SUBSTRATE ASSEMBLY

FIELD OF THE INVENTION

The present invention relates to a display panel substrate assembly and an apparatus and method for forming a display panel substrate assembly.

BACKGROUND

Current methods of lamination for bonding, for instance, a clear optical substrate, such as glass or clear plastic, to another substrate can be achieved using acrylic tape, acrylic based film type adhesive material or acrylic based adhesive.

Substrate to substrate lamination methods for touch panel devices using acrylic tape as the securing means may introduce air spaces in between the substrates. The air spaces undesirably reduce optical clarity as the refractive index between air, and glass, polymethyl methacrylate (PMMA) or polyethylene terephthalate (PET) (typical optical lens material) are very different. FIG. 16 illustrates a prior art embodiment using acrylic tape 134 to adhere an optical lens substrate 132 and a touch panel substrate 136, and to adhere the touch panel substrate 136 to a Liquid Crystal Display (LCD) substrate 138. Air spaces 130 are disposed in between the substrates.

Lamination methods using film type adhesive material tend to have difficulties eliminating bubbles formed during lamination. The problem is especially tricky for large size substrates of 7 inches (diagonal measurement) and above. Film type adhesive material requires an additional step of die cutting the film material to specific sizes for usage. Furthermore, reworking a product laminated using film type adhesive material can be particularly difficult.

A conventional lamination method using film type adhesive material requires careful selection of several process parameters. Such process parameters include a roller (used for applying pressure over the film type adhesive material) tilt angle, speed of rolling, force of rolling, thickness of the film type adhesive, temperature of lamination, and so on. For big panel substrates (e.g. 7 inches diagonal and above), production yield is usually less than satisfactory despite careful selection of the process parameters.

Moreover, in the conventional lamination method, using film type adhesive material, laminated products or assemblies with bubbles undesirably formed during lamination need to be placed into an autoclave chamber for about 2 to 5 hours depending on the size of bubbles and the number of bubbles to reduce the bubbles to sizes not discernible to human eyes. Defective products with different degrees of bubble problems need to be separated into different batches, each batch having different exposure time in the autoclave chamber. In a mass production environment, separation of the defective products into different batches is difficult to manage and time consuming.

Display panel substrates formed using liquid-type Ultra Violet (UV) curable adhesives have significant disadvantages because existing techniques using these adhesives are in their infancy. For instance, several problems arise from use of existing liquid-type UV curable adhesives for the formation of display panel substrate assemblies. One particularly prevalent problem arises from the unwanted presence of air bubbles in the adhesive, leading to poor optical clarity of the substrate.

In addition, an 'overflow' problem exists for low viscosity adhesives currently in use. These adhesives are typically provided with a viscosity value in the range of between 1000 mpas to 15000 mpas. At such viscosity values, liquid resistance to flow is weak and the adhesive has tendency to overflow, i.e. spread or spill over undesirably. Efforts have been made to address this problem by seeking to dispense very carefully in a precise manner the right amount of adhesive to apply to a substrate area. However, this presents, indeed introduces, a fresh set of challenges in order to ensure that the amount of adhesive which is dispensed is of the right shape and size for a specific lamination process. Typically, the adhesive cannot be controlled to achieve the acceptable overflow of the adhesive at all the edges because the precision of adhesive dispensing volume cannot achieve the acceptable accuracy of less than 3% error rate. As a result, there may be numerous product rejects and yield is poor. Although reworking of defective products is possible for products laminated using adhesive, the process is repetitive and labor-intensive, thereby leading to delays in the manufacturing process, additional costs and/or less than desirable yield rates.

In an attempt to improve yield, some manufacturers use time based methods to provide time for the adhesive to flow to the laminated product or assembly edges before curing the adhesive using UV radiation. However, this does not solve the problem of lack of flow control due to low liquid viscosity and, indeed, lengthens the lamination process even further. The dispensed adhesive volume still cannot be controlled within the desired overflow tolerance. The adhesive flow out tolerances are typically 0.5 mm to 1 mm depending on product design requirements.

Overflow is undesirable as the overflowed adhesive could contaminate the surroundings of the substrate. Also, once overflowed adhesive has hardened after curing, the hardened adhesive could alter the dimensions of the laminated product, making the laminated product difficult for assembling into another part of the complete product, such as an electronic device.

SUMMARY

The methods and apparatuses discussed herein address at least some of the aforementioned problems. For example, a substrate manufactured in accordance with the techniques disclosed herein utilizing the disclosed methods and apparatus for forming the display panel substrate assembly may provide significant advantages over substrates manufactured in accordance with known techniques. Implementation of the methods disclosed herein will at least alleviate and may significantly solve the problem of poor optical clarity due to the presence of air bubbles in the adhesive. In addition, the techniques disclosed herein also provide a significant advantage in that the adhesive used is not subject to overflow.

In accordance with one aspect of the present invention, there is provided a method for forming a display panel substrate assembly. The substrate assembly includes a first substrate and a second substrate with at least one of the first substrate and the second substrate being optically clear. The method includes the steps of: printing a non-sag adhesive composition onto a surface of the first substrate; bringing the non-sag adhesive composition into contact with a surface of the second substrate in an environment having a pressure less than or equal to about 5000 pascals; and curing the non-sag adhesive composition to yield an adhesive layer. The non-sag adhesive composition is of a type which is optically clear after curing.

In one embodiment, the non-sag adhesive composition may include a reaction product of a multifunctional (meth) acrylate oligomer, a reactive diluent including a monofunctional (meth)acrylate monomer having a viscosity of from about 4 to about 20 cps at 25° C., and a plasticizer.

In one embodiment, bringing the non-sag adhesive composition into contact with the surface of the second substrate may be performed in an environment having a pressure less than or equal to about 2000 pascals.

In one embodiment, the method may further comprise, after bringing the non-sag adhesive composition into contact with the surface of the second substrate and before curing the non-sag adhesive composition, raising the pressure in the environment of the display panel substrate assembly to greater than atmospheric pressure. The pressure may be raised to between about 200,000 pascals and about 600,000 pascals.

In one embodiment, the method may further comprise the step of effecting relative movement between the second substrate and the first substrate at a first speed to bring the second substrate and the first substrate to a distance of between about 0.025 mm and about 2 mm away from one another before effecting further relative movement between the second substrate and the first substrate to bring the second substrate and the first substrate to a predefined distance from one another at a second speed. The second speed is slower than the first speed.

In one embodiment, the predefined distance may be equal to a thickness of the non-sag adhesive composition applied on the first substrate.

In one embodiment, the second speed may be in the range of about 0.05 mm/sec to about 1 mm/sec.

In one embodiment, the method may further comprise the step of deriving the predefined distance based on dimensional tolerances of the first substrate and the second substrate.

In one embodiment, the method may further comprise lowering the environment to a pressure less than or equal to about 5000 pascals after the second substrate is brought to a distance of about 0.025 mm to about 2 mm away from the first substrate.

In one embodiment, at least one of the first substrate and the second substrate may be a curved substrate.

In one embodiment, the non-sag adhesive composition is printed on the surface of the first substrate by stencil printing.

In accordance with another aspect of the present invention, there is provided an apparatus for forming a display panel substrate assembly. The substrate assembly comprises a first substrate and a second substrate, one of the first substrate and the second substrate being optically clear. The apparatus comprises a printing device for applying a non-sag adhesive composition onto a surface of the first substrate, a chamber for the non-sag adhesive composition to be brought into contact with a surface of the second substrate therein at a pressure less than or equal to about 5000 pascals, and a curing device for curing the non-sag adhesive composition to yield an adhesive layer. The non-sag adhesive composition being of a type which is optically clear after curing.

In one embodiment, the first substrate may have a first refractive index, the second substrate may have a second refractive index and the adhesive layer may have a third refractive index in between and within about 10% of the first and second refractive indices.

In one embodiment, the non-sag adhesive composition may comprise a reaction product of a multifunctional (meth) acrylate oligomer, a reactive diluent comprising a monofunctional (meth)acrylate monomer having a viscosity of from about 4 to about 20 cps at 25° C., and a plasticizer.

In one embodiment, the apparatus may comprise a plurality of side guides movable towards the first substrate from opposite sides of the first substrate to push the first substrate into position facing the surface of the second substrate prior to bringing the non-sag adhesive composition into contact with the surface of the second substrate.

In one embodiment, the apparatus may comprise adjustable holding mechanisms for holding the first substrate and the second substrate, the holding mechanism for the first substrate being adjustable to tilt the first substrate such that the first substrate and the second substrate are aligned prior to bringing the non-sag adhesive composition into contact with the surface of the second substrate.

In one embodiment, the curing device may comprise a minor for directing light from a curing source towards the non-sag adhesive composition exposed between the first substrate and the second substrate after the non-sag adhesive composition is placed into contact with the surface of the second substrate.

In accordance with another aspect of the present invention, there is provided a display panel substrate assembly. The display panel substrate assembly comprises a first substrate and a second substrate, wherein one of the first substrate and the second substrate is optically clear. The first substrate and the second substrate are adhered together with a non-sag adhesive composition that was screen-printed onto the first substrate, and being of a type which is optically clear after curing. The non-sag adhesive composition was brought into contact with the second substrate in an environment at a pressure less than or equal to about 5000 pascals. The non-sag adhesive composition was cured to yield an adhesive layer.

In one embodiment, the first substrate may have a first refractive index, the second substrate may have a second refractive index and the adhesive layer may have a third refractive index in between and within about 10% of the first and second refractive indices.

In one embodiment, the non-sag adhesive composition may comprise a reaction product of a multifunctional (meth) acrylate oligomer, a reactive diluent comprising a monofunctional (meth)acrylate monomer having a viscosity of from about 4 to about 20 cps at 25° C., and a plasticizer.

In one embodiment, at least one of the first substrate and the second substrate may be a curved substrate.

In one embodiment, at least one of the first substrate and the second substrate may be deformable.

In one embodiment, the printing device may comprise a rib extending in the printing area from a first side of the stencil to a second side of the stencil, wherein the rib may comprise a side having a tapered portion.

In one embodiment, the printing area may have a corner area. The corner area may have a cut-away portion.

In accordance with another aspect of the present invention, there is provided a stencil for printing adhesive on a substrate of a display panel substrate assembly. The stencil comprises a rib extending in the printing area from a first side of the stencil to a second side of the stencil, wherein the rib comprises a side has a tapered portion.

In one embodiment, the printing area may have a corner area. The corner area may have a cut-away portion.

BRIEF DESCRIPTION OF THE DRAWINGS

Embodiments of the invention will be better understood and readily apparent to one of ordinary skill in the art from the following written description, by way of example only and in conjunction with the drawings, in which.

Figure 1:
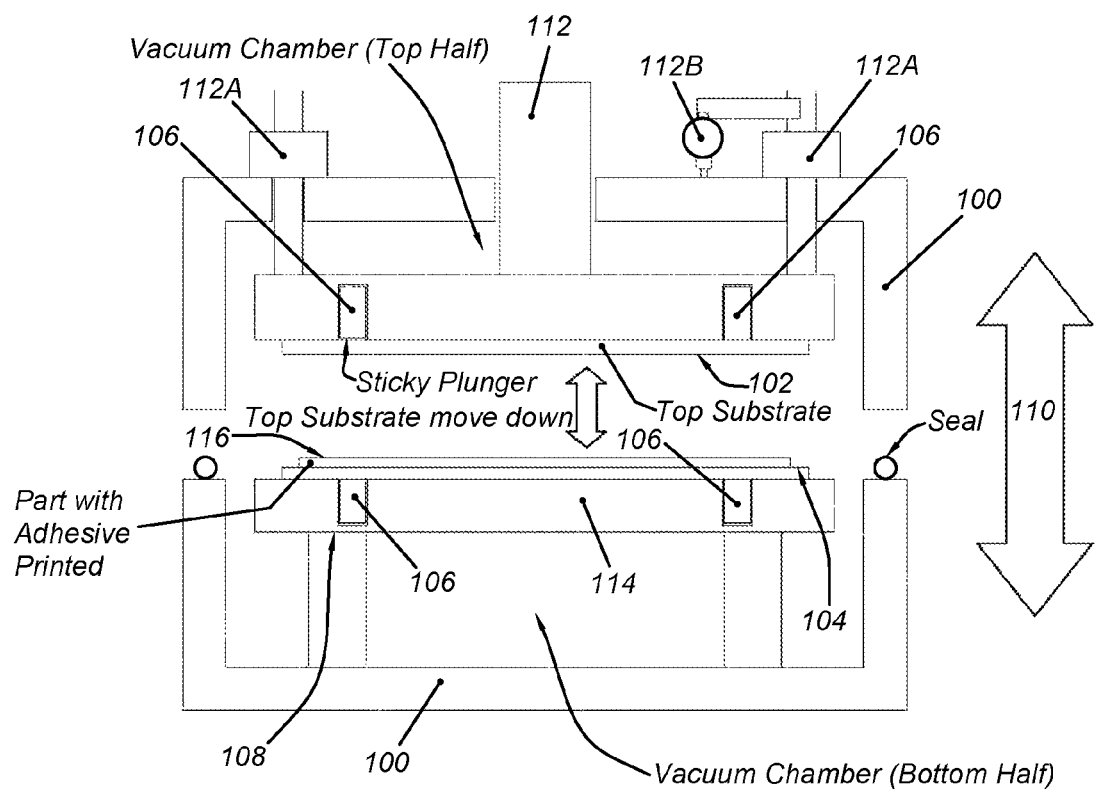
FIG. 1 is a side view of an apparatus for forming a panel substrate assembly.

These figures are not drawn to scale and are intended merely for illustrative purposes.

DETAILED DESCRIPTION

The term "printing" used herein refers to any industrial method of printing liquid adhesives in the generic sense, examples of which include printing involving the use of a screen, alternatively known as screen printing, as well as printing involving the use of a stencil, alternatively known as stencil printing.

In some embodiments, screen printing may be used to print non-sag adhesive compositions in which a screen is employed as an image carrier in the printing process. The screen may comprise a rigid frame having a mesh stretched across the frame, and a mask bearing the required image being formed on the mesh. The mask may be derived from a photosensitive emulsion applied to one or both sides of the mesh. When the emulsion is hardened on the mesh, it forms the negative of the image to be printed. Openings in the mask allow liquid adhesive to be deposited, thereby forming the positive of the image to be printed. The mask has a defined thickness on the underside facing the surface to be printed to provide a separation between the screen mesh and surface of substrate to be printed that determines the quantity of adhesive being deposited. During printing, the screen and substrate are initially spaced apart. Liquid adhesive to be deposited is mass-dispensed on the back of the screen. A squeegee is actuated to firstly push the screen into contact with the substrate, and then to spread the adhesive over the screen in one or more strokes. When the liquid adhesive is spread over mask openings in the screen, it moves through the screen's mesh and into the mask openings to deposit on the substrate a plurality of individual cells of liquid adhesive according to the mesh size of the screen, which subsequently coalesce to form a continuous adhesive coat according to the pattern defined by the mask. Surplus liquid adhesive remaining at the end of one squeegee stroke is removed or used for the next printing stroke.

In some embodiments, stencil printing may be used to print non-sag adhesive compositions in which a stencil is placed on the substrate and the non-sag adhesive composition is printed by via brushing, spraying, or squeeging through the openings of the stencil. The stencil frame may be fabricated from thin metal, plastic or any other material impermeable to the liquid adhesive. In stencil printing, a screen mesh is not present. Squeeging may be used to obtain a smooth and uniformly thick adhesive liquid coating, though in some embodiments a squeegee is not required. The stencil preferably has only the outer boundary, or perimeter, defined by the metal, plastic or cardboard, leaving the interior of the stencil completely free of metal, plastic or cardboard. Optionally, inner ribs or narrow lengths of metal, plastic or cardboard may span the interior of the stencil from one side to the other for reinforcement of the stencil or to prevent sagging of the squeegee in the interior portions of the stencil. Adhesive may be dispensed on the stencil and then spread across the stencil by the squeegee, or the adhesive may be deposited on the stencil by dispensing it ahead of a notch bar and moving the notch bar and substrate relative to each to spread the adhesive as a layer on the substrate, without use of a squeegee. During printing, the stencil may be seated directly onto the substrate while the squeegee moves over the stencil to spread the adhesive. As the squeegee moves over the stencil, liquid adhesive is moved over openings in the stencil and gets deposited on the substrate beneath. Thereafter, the stencil is lifted from the substrate, leaving behind the liquid adhesive.

While both are applicable, the choice of stencil printing or screen printing may depend on various factors. Screen printing may be used for printing complex images in some instances. For example, mesh support in a screen allows freedom of mask design. In some instances, stencil printing may be used if the medium to be printed has high viscosity or contains particles which may be hindered by a screen. Stencil printing may also have better print definition due to the absence of a mesh. Stencil printing may further allow for thick deposits to be printed by using a thick stencil, in contrast to using a screen which will be challenging with a thick polymer mask.

FIG. 1 shows an example of an apparatus for forming a panel substrate assembly. The substrate assembly comprises a first substrate 104 and a second substrate 102. The apparatus comprises a chamber 100, and a device 114 comprising a first substrate holding mechanism 108 and a second substrate holding mechanism 106. The first substrate 104 has an adhesive 116 applied to a surface thereof. Adhesive 116 is a non-sag adhesive composition which remains optically clear after curing, also known as liquid optically clear adhesives (LOCA). During the method for forming the panel substrate assembly i.e. the lamination process, the adhesive is brought into contact with a surface of the second substrate 102 by the device 114. The adhesive 116 is brought into contact with the surface of the second substrate 102 under an environment having air pressure of 0 to 5000 pascals.

Unless stated otherwise terms such as "first" and "second" are used to distinguish between the elements such terms describe. Thus, these terms are not necessarily intended to indicate temporal or other prioritization of such elements. Accordingly, in the example of FIG. 1, substrate 102 could alternatively have been considered the "second substrate" and substrate 104 could alternatively have been considered the "first substrate" with adhesive 116 being screen-printed on a surface thereof. Similarly, the same would apply to the example of FIGS. 12 to 14.

The two substrates 102, 104 are held by the holding mechanisms 106 and 108 respectively. The second substrate holding mechanism 106 is mounted to a servo press machine 112 operated to move the second substrate holding mechanism 106. The second substrate holding mechanism 106 is movable in vertical directions 110 to bring the second substrate 102 towards the first substrate 104 or away from it. Of course, it will be appreciated that in the alternative it may be the first substrate 104 which is moved with respect to the second substrate 102. Alternatively, both of the substrates 102, 104 may be moved towards one another. The pressure exerting on the 2 substrates is supplied by a air cylinder 112A with adjustable pressure control. The pressure needed for a lamination to take place will depend on the type and viscosity of LOCA used, the thickness of LOCA applied, and the flatness of the substrate. The methodology to check the pressure and ensure compression does not exert the threshold is by linking a gauge (112B). The gauge is fixed onto the fixture where the air cylinder is mounted (112B). The gauge will indicate and relate the compression ratio to the pressure applied onto the LOCA which is between the top and bottom substrate during lamination. Initial gradual increase in compression force contributes to spreading the LOCA uniformly by surface tension. A dwell time will be introduced while compression force is maintained, stabilizing LOCA compression flow. Subsequently, a gradual decrease of compression force is applied. Decompression is controlled by vacuum release speed while top holding mechanism is deactivated. This is to prevent de-lamination as top substrate maybe still in contact with the top plate by means of static or remaining vacuum force. The two substrates 102, 104 could be placed into the chamber 100 automatically by machinery, e.g. robot arms, or manually by hand. The substrates 102, 104 may be arranged to be picked up from a tray or a platform on a conveyor in a production area before being placed in the chamber 100.

At least one of the substrates is optically clear, such as a glass or clear plastic lens. The other substrate could be an organic light emitting diode (OLED) substrate, liquid crystal display (LCD) substrate, and the like. In the example, the second substrate 102 is a clear optical substrate and the first substrate 104 is an OLED substrate. The chamber 100 is arranged for the pressure therein to be varied, at least to a pressure below atmospheric pressure. In one implementation, chamber 100 may operate to create at least a partial vacuum therein. Pressure within chamber 100 may also be raised to pressures above atmospheric pressure as will be described in further detail below.

The holding mechanisms 106, 108 may be, for instance, vacuum chucks, electrostatic chucks or mechanical edge grippers. Electrostatic chucks employ the principles of electrostatic attraction to hold the substrates. Vacuum chucks comprise conduits through which air is drawn (preferably constantly, or substantially constantly) to hold the substrate 102 and/or 104 by suction. However, when subjected to a negative pressure or "vacuum" environment having air pressure of about 0 to 5000 pascals, the suction or holding pressure at the conduit opening would normalize with the environment and prevent the substrate 102 and/or 104 from being held firmly. As such, solutions to this problem are required, as will be discussed later. Mechanical edge grippers are robotic claws or the like with movements controllable by a control system. If mechanical edge grippers are used, it is preferable that the substrates 102 and/or 104 are of a certain minimum thickness of about 0.8 mm and above so that they would not be damaged by the mechanical edge grippers.

Adhesive 116 is screen-printed onto a surface of one of the first and second substrates 104, 102. In the example, the first substrate 104 is the one applied with the adhesive 116.

The adhesive 116 used is a non-sag adhesive composition. Suitable adhesives 116 are discussed in further detail below. Both screen printing and stencil printing may be used. In some embodiments, the screen printing method is used as it can provide printing consistency at relatively low cost and in a short time frame compared to other methods of applying adhesive onto substrates such as dispensing the adhesive using a syringe or transfer printing involving a drum. In some embodiments, stencil printing is used to avoid adhesive overflow issues The adhesive 116 is of the type that is sufficiently resistant to forces and vibrations it encounters when the substrate on which the adhesive 116 is applied is transferred from a station for screen printing of adhesive 116 to the chamber 100 for lamination, or from the chamber 100 to a station for curing the adhesive.

The adhesive 116 is of a type that is optically clear—at least after curing—and may have a refractive index within range of refractive indices of the second substrate 102 and the surface of the first substrate 104. This is to prevent lack of optical clarity which might otherwise happen if the values for the respective refractive indices of the substrates and the adhesive 116 are too different and excessive refraction takes place. The refractive index of glass ranges from 1.43 to 1.74. The refractive index of polycarbonate is 1.58. Hence, if the second substrate 102 is made of glass and the first substrate 104 is made of polycarbonate, adhesive composition of adhesive 116 (hereinafter also known as adhesive 116) when cured to yield an adhesive layer disposed between the first and second substrates 104, 102 would advantageously have a refractive index of between about 1.4 to 1.8 or between 1.43-1.58 or 1.58-1.74 depending on the refractive index of the glass. Furthermore, it is appreciated that the first substrate 104 may have a first refractive index, the second substrate 102 may have a second refractive index and the adhesive layer may have a third refractive index in between and within 10% of the first and second refractive index.

The first and second substrates 104, 102 may each have a protective layer (not shown in FIG. 1) located on the respective surfaces of the first and second substrates 104, 102 that are to be bonded together. The protective layer prevents dust particles from settling on the surfaces of the first and second substrates 104, 102 and protects the surfaces from physical damage, which might cause scratches or other irregularities thereon. The protective layer of the second substrate 102 can be removed by machines or by hand before or after the second substrate 102 is placed in the chamber 100. In the example, the protective layer of the second substrate 102 is removed before the second substrate 102 is placed in the chamber 100.

In the example, the first substrate 104 is coated with adhesive 116 prior to placement in the chamber 100 for bonding with the second substrate 102. The protective layer of the first substrate 104 is removed before the first substrate 104 is coated with the adhesive 116.

Figure 2:
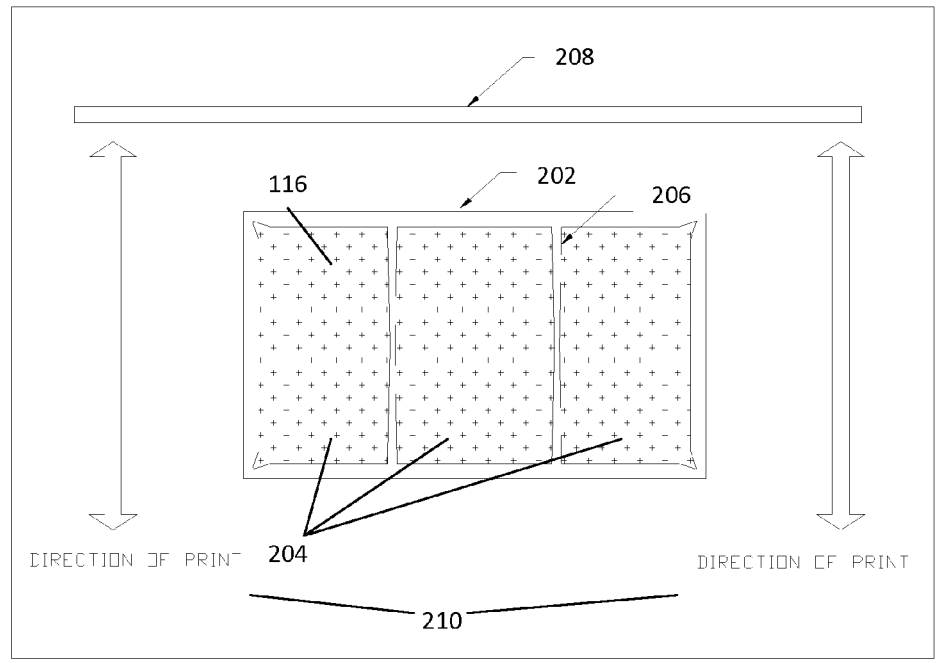
FIG. 2 is a top view of a substrate having adhesive printed thereon and a stencil for printing located thereon.

With reference to FIGS. 1 and 2, application of the adhesive 116 to the first substrate 104 is effected by a printing process which involves use of a stencil 202, namely, stencil printing. In the example, the stencil 202 is made of stainless steel and is substantially rectangular in shape. The stencil 202 has openings to allow the adhesive 116 to spread over the surface of the first substrate 104. The stencil 202 is a thin and flat sheet of metal lying parallel to a plane defined by directions 208 in which a print head travels to print the adhesive 116 during the screen printing process. Openings 204 of the stencil 202, i.e. the areas 204 of the first substrate 104 uncovered by the stencil 202, have the adhesive 116 screen printed thereon. The stencil 202 is removed by hand manually or by machinery automatically after the adhesive 116 is screen printed on the first substrate 104. In the example, the printing process is shielded from UV light from any light source around the production area for laminated products to prevent premature curing of the adhesive 116.

By using a printing process described above, fine control of the thickness of the adhesive is achieved to prevent visual failure like Newton's ring or "waviness" due to inconsistent or uneven application of adhesive. Use of a stencil such as stencil 202 as described above, and adhesive 116 as described above may provide a significant improvement upon known techniques. The thickness of the stencil 202 controls the thickness of the adhesive 116 printed on the first substrate 104. The thickness of the stencil 202 is equivalent to the adhesive thickness printed on the first substrate 104. After printing, the adhesive 116 can settle and retain its shape on the first substrate 104 as it is of a non-sag type.

Stencil 202 has openings 204 with shape and sizes dependent on the shape and the size of the area to be printed on the substrate (in this case, the first substrate 104) to print the adhesive 116, and the size of the substrates (in this case, the substrates 102, 104) to be laminated.

Figure 3:
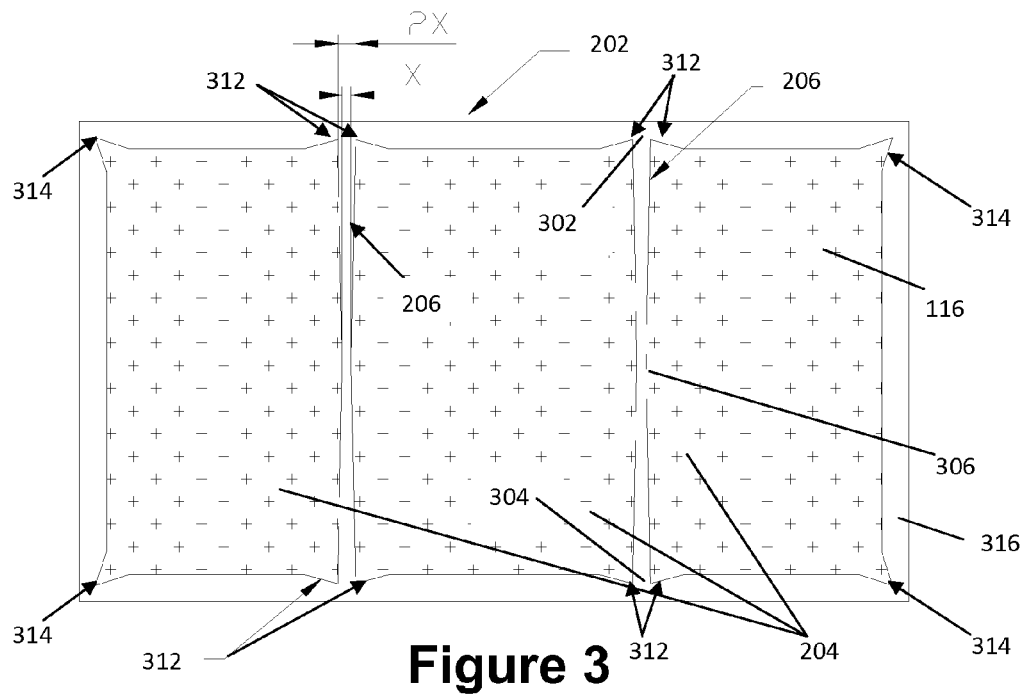
FIG. 3 is a top view of a substrate having adhesive printed thereon and a stencil for printing located thereon.

With reference to FIGS. 2 and 3, depending on the size of the substrates 102, 104, one or more ribs 206 could be incorporated into the design of the stencil 202 to provide a sturdy frame for the stencil 202 as well as to alleviate scooping effect, which causes uneven spreading of adhesive 116 when the openings 204 of the stencil 202 are too large. Scooping effect is a problem whereby the amount of adhesive 116 spread over the openings 204 of the stencil 202 is thicker at the edges of the stencil 202 and thinner towards the centre of the stencil 202. The one or more ribs 206 divide openings of the stencil 202 into smaller openings to mitigate problems which might be caused by scooping effect.

Furthermore, each of the ribs 206 extend from a first end 302 of the stencil 202 towards a second end 304 of the stencil 202. Each rib 206 tapers from the first end 302 or the second end 304 of the stencil 202 towards an apex 306 of the rib between the first end 302 and the second end 304. In the example, the apex 306 of the rib 206 has thinnest width compared to the width of the ribs 206 at the first end 302 and the second end 304. Tapering of the ribs 206 helps to reduce occurrence of trapped air bubbles in the adhesive 116 flows during the lamination process i.e. when the substrates (102, 104 in FIG. 1) are bonded with adhesive 116. In the example, the width, X, of the ribs varies from one side 302 to the other side 304 and the thickest portions 302, 304 at the ends of the rib 306 have width, which are twice the thickness of X i.e. 2X.

Figure 5:
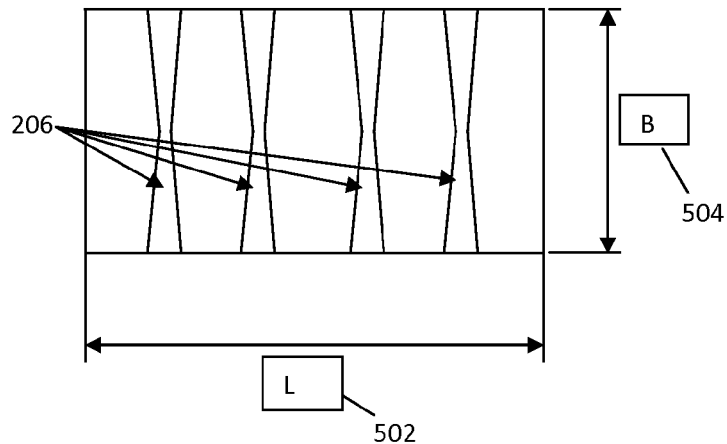
FIG. 5 illustrates shapes of a plurality of ribs of a stencil.
Figure 5A:
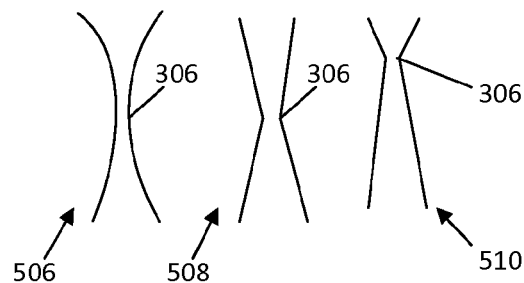
FIG. 5A illustrates rib design embodiments of a stencil.

With reference to FIG. 5A, which shows a few samples of rib design for the stencil 202 described with reference to FIGS. 2 and 3, it is appreciated that the tapering of each rib 206 described with reference to FIGS. 2 and 3 could be curved, e.g. rib 506, or having multiple straight edges, e.g., ribs 508 and 510. The locations of the apex 306 need not be at the centre of the rib like rib 508. Rib 510 has an apex that is off centre.

With reference to FIG. 3, the four corners of each of the stencil openings 204 have cut away portions 312 and 314, which are shaped in a manner to provide more adhesive spread at the corners. Four cut away portions 314 are located close to the four outermost right angled corners of the substantially rectangular shaped stencil 202 respectively. Each of the four portions 314 is a V-shaped cut with the tapered end (i.e. the pointed end of the "V") pointing towards the sharp edge of the respective right angled corner of stencil 202. The shape of the cut away portions 314 advantageously allow for sufficient spreading of adhesive 116 towards the corner tips of the substrate 104 during the lamination process. In FIG. 3, there are another eight cut away portions 312 located at eight respective corners at the intersections of the ribs 206 and circumferential portions 316 of the stencil 202. The circumferential portions 316 of the stencil 202 outline the four rectangular sides of the stencil 202. The ribs 206 are substantially perpendicular to two of said circumferential portions 316 of the stencil 202 that are parallel to each other. The cut away portions 312 are each substantially shaped in the form of a right angled triangle with one of its side substantially parallel to the length of one of the ribs 206. The shape of the cut away portions 312 advantageously provide sufficient spreading of adhesive 116 to cover wider portions of the gap formed by the tapered ribs 206 during the lamination process.

Periodic cleaning of the printing machine, for instance, on the underside of the stencil 202 is necessary for prolonged usage. A cleaning blade (not shown in the Figures) may be used to brush the surface of the stencil 202 to clean off excessive adhesive which might pass through the openings of the stencil 202, to reduce the possibility of any problems occurring from residual adhesive coming into contact with the first substrate 104 during printing on the first substrate.

Figure 4:
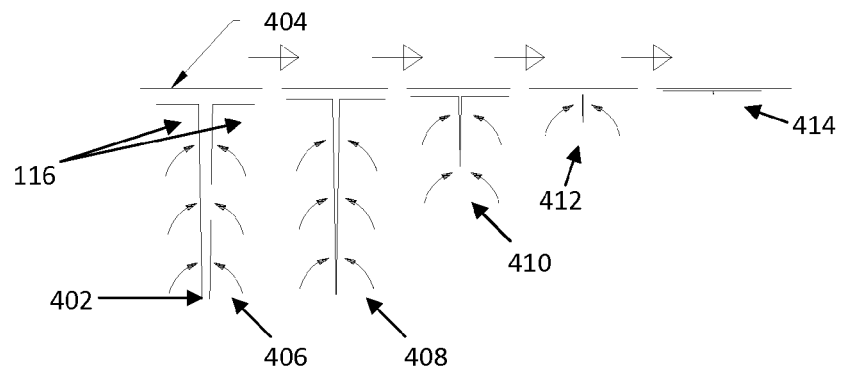
FIG. 4 shows consecutive top views of a substrate applied with adhesive to illustrate manner of adhesive flow.

FIG. 4 illustrates how air bubbles are prevented from occurring when the adhesive 116 flows. In FIG. 4, with reference to the components in FIGS. 1 to 3, there are 5 consecutive snapshots 406, 408, 410, 412 and 414 in order illustrating flow of the adhesive 116 during the lamination process. In the chamber 100, the adhesive 116 on the first substrate 104 will spread over the surface of the first substrate 104 when the second substrate 102 is pressed on the first substrate 104. The areas previously covered by the stencil 202 will then be covered with the adhesive 116 as the second substrate 102 is brought closer to the first substrate. More specifically, the adhesive 116 will flow "inwards" to cover up open surface area where the ribs 206 of the stencil 202 masked the surface of the substrate 104 and will spread to the edges of the first substrate 104. Due to the tapered design of the ribs 206, when the adhesive 116 spreads over the areas previously covered by the ribs 206, the adhesive 116 closer to the centre 402 of the first substrate 104 will flow first and the adhesive closer to the edge 404 of the first substrate 104 will flow last. This order of flowing prevents the formation of air bubbles. Should the order be reversed, i.e. adhesive closer to the edge 404 will undesirably flow first and adhesive closer to the centre 402 will flow last, thereby causing air bubbles to be trapped towards the centre of the substrate surface once a closed space is formed by the adhesive 116.

With reference to FIG. 5, the number of ribs 206 to have for the stencil (202 in FIG. 2) will depend on the size of the substrates (102, 104 in FIG. 1) being laminated. Examples of the number of ribs to have for substrates of certain dimensions are shown in table 1 as follows.

TABLE 1

| Number of rib(s) 206 | Length ('L', 502) and Breath ('B', 504) |
|---|---|
| 0 | 1 to 3 inches or 2.54 to 7.62 cm |
| 1 | 3.5 to 6 inches or 8.89 to 15.24 cm |
| 3 | 6.5 to 9 inches or 16.51 to 22.86 cm |
| 4 | 9.5 to 12 inches or 24.13 to 30.48 cm |
| 5 | 12.5 to 15 inches or 31.75 to 38.1 cm |
| 6 | 15.5 to 18 inches or 39.37 to 45.72 cm |
| 7 | 18.5 to 21 inches or 46.99 to 53.34 cm |
| 8 | 21.5 to 24 inches or 54.61 to 60.96 cm |
| 9 | 24.5 to 27 inches or 62.23 to 68.58 cm |

'L' 502 refers to the length of the substrate and 'B' 504 refers to the breadth of the substrate. The substrate illustrated in FIG. 5 is substantially rectangular.

Figure 6:
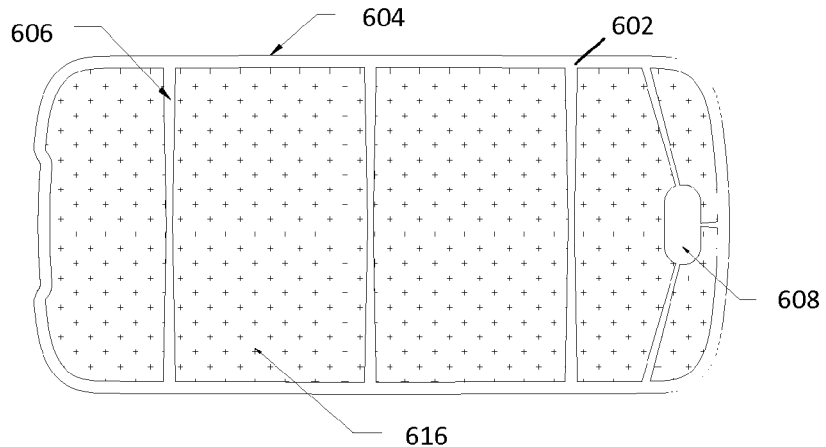
FIG. 6 is a top view of a substrate having adhesive printed thereon and a stencil for printing located thereon.

FIG. 6 illustrates selective area adhesion. The design of a stencil 602 could be made to mask an area 608 of a substrate 604 of a mobile device so that adhesive is not printed on the area 608 during the printing process. The area 608 covered could, for instance, be a location for microphone or camera lens of the mobile device. Such selective area adhesion is advantageously performed with a non-sag type adhesive having viscosity in the range of 16000 centipoise (cps) or millipascal-seconds (mPa·s) to 50000 cps or mPa·s described herein.

Figure 7:
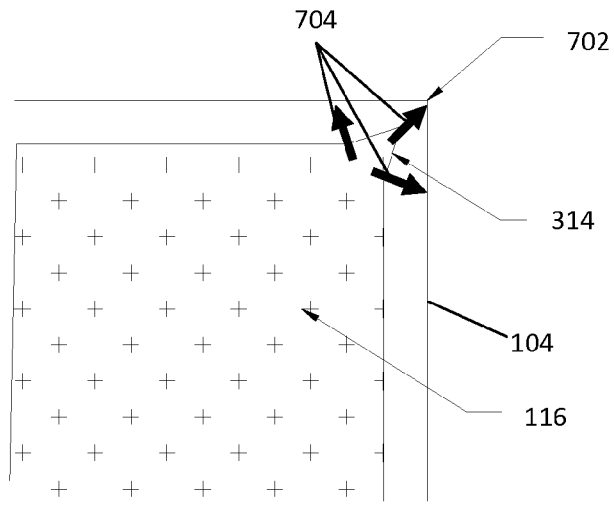
FIG. 7 is a corner view of a substrate having adhesive printed thereon.

FIG. 7 shows an enlarged view of one of the four corners of the stencil 202 in FIG. 3. FIG. 7 indicates the directions 704 in which the adhesive 116 in the form of the V-shaped cut away portion 314 would spread when the adhesive 116 is compressed during the lamination process. The spread of the adhesive 116 would skew towards the corner of the first substrate 104, reaching even the corner tip 702.

Figure 8:
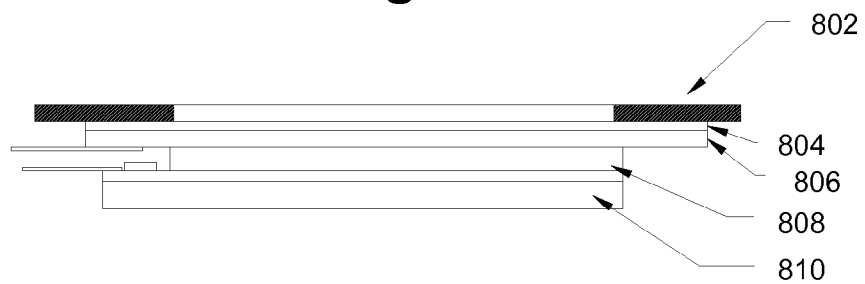
FIG. 8 is a side view of a panel substrate assembly laminated using adhesive.
Figure 16:
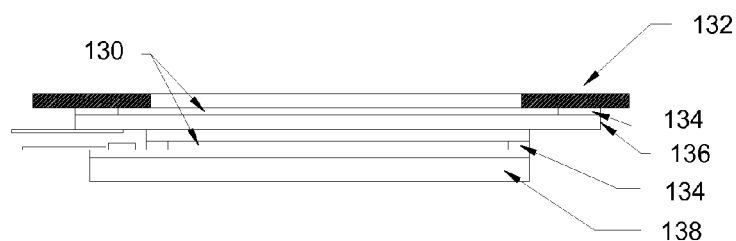
FIG. 16 is a side view of a prior art panel substrate assembly laminated using acrylic tape.

FIG. 8 shows a product made using the example of the apparatus of lamination of the present invention discussed herein with reference to FIGS. 1 to 7. An optical lens substrate 802 is adhered to a touch panel substrate 806 through a layer of adhesive 804 (116 in preceding figures), and the touch panel substrate 806 is adhered to a Liquid Crystal Display (LCD) substrate 810 through a second layer of adhesive 808 (116 in preceding figures). Unlike the prior art product in FIG. 16, there are no air spaces disposed in between the substrates. Optical clarity issues can be eliminated by ensuring that the adhesive 116 has the same or similar refractive index as the optical lens substrate 802. The thickness of the layers 804, 808 of the adhesive is preferably about 0.8 mm in the example.

In more detail, the adhesive composition of the adhesive 116 discussed herein is non sag, optically clear and curable. Herein, non-sag refers to the property that the adhesive 116 exhibits no or very little flow under zero or near-zero shear stress conditions. A non-sagging adhesive preferably has high viscosity e.g. 16000 to 50000 cps (or mPa·s), and more preferably has thixotropic behavior. In some embodiments, the adhesive layer may be formed from a liquid optically clear adhesive having thixotropic properties. Thixotropic adhesives are characterized in that they decrease in viscosity (shear thin) when subjected to a shearing stress over a given period of time with subsequent recovery or partial recovery of viscosity when the shearing stress is decreased or removed. The advantage of the thixotropic property is that the adhesive composition can be dispensed easily by such processes as needle dispensing, due to the rapid decrease in viscosity under low shear rate conditions. One advantage of an adhesive exhibiting thixotropic behavior compared to an adhesive exhibiting high viscosity is that high viscosity adhesives are difficult to dispense and to cause to flow during the squeegee or rolling process, whereas the adhesives exhibiting thixotropic behavior can be dispensed and will flow under shear. Adhesive compositions can be made thixotropic by adding particles to the compositions. In some embodiments, fumed silica is added to impart thixotropic properties to a liquid adhesive, in an amount of from about 2 to about 10 wt. %, or from about 3.5 to about 7 wt. %.

In some embodiments, any liquid optically clear adhesive having a viscosity of no more than 30 Pa·s, particularly between about 2 and about 30 Pa·s and more particularly between about 5 and about 20 Pa·s at a shear rate of 1 to 10 $\sec^{-1}$ can be combined with a thixotropic agent to form an optically clear adhesive having thixotropic properties suitable for stencil printing or screen printing. The efficiency of the thixotropic agent and the optical properties depend on the composition of the liquid optically clear adhesive and its interaction with the thixotropic agent. For example, in the case of associative thixotropes or hydrophilic silica, the presence of highly polar monomers such as acrylic acid, acid or hyxdroxyl containing monomers or oligomers may disrupt the thixotropic or optical performance.

In some embodiments, the viscosities of the liquid optically clear adhesive may be controlled at two or more different shear rates.

The adhesive composition used herein experiences an evolution of shear rates during the printing process as modeled by J. Kevra, "Estimation of Shear Rates During Rolling in the Screening and Stenciling Process", *The International Journal for Hybrid Microelectronics*, Vol. 12, No. 4, pp. 188-194 (1989). For example, the adhesive composition may experience shear rates of zero to a few $\sec^{-1}$ as the adhesive composition is first applied to the stencil 202. The maximum shear rate of several hundred to about 1000 $\sec^{-1}$ happens when the adhesive composition is forced through the stencil 202 during the squeegee or rolling process. At these high shear rates, the viscosity of adhesive 116 is low and readily flows through openings 204 of the stencil 202. As the adhesive composition exits the stencil 202 onto its intended substrate 104, it experiences a rapid decrease in shear rate and eventually reaches a zero shear rate condition at which time the viscosity has again built up rapidly to allow the adhesive composition to be in a non-sag condition.

It has been found that it is possible to achieve a non-sag adhesive by controlling the viscosities of the adhesive at least at two different shear rates. More specifically, for example, the adhesive composition is characterized in that it has a viscosity of 18 Pa·s to 140 Pa·s at a shear rate of 1 $\sec^{-1}$ and a viscosity of 700 Pa·s to 4200 Pa·s at 0.01 $\sec^{-1}$. When the adhesive composition has a viscosity of 18 Pa·s to 140 Pa·s at a shear rate of 1 $\sec^{-1}$, the adhesive composition may be deposited on the stencil 202 and squeegee through the openings 204 of the stencil 202 as described above.

Furthermore, because the adhesive composition of the present disclosure has a viscosity of 700 Pa·s to 4200 Pa·s at a shear rate of 0.01 $\sec^{-1}$, the adhesive 116 retains its non-sag behavior after exiting the openings 204 of the stencil 202 onto the lower surface substrate 104.

The above viscosities values were determined at 25° C. using an AR2000 Rheometer (manufactured by TA Instruments) equipped with a 40 mm diameter×1° cone and scanned over the shear rate range of 0.001 to 100 $\sec^{-1}$.

In one embodiment, the adhesive layer has a viscosity of between about 2 and about 30 Pa·s and particularly between about 5 and about 20 Pa·s at 25° C. and a shear rate of 10 $\sec^{-1}$. In one embodiment, the adhesive layer has a viscosity of between about 700 and about 10,000 Pa·s and particularly between about 1,000 and about 8,000 Pa·s at 25° C. and a shear rate of 0.01 sec'. In one embodiment, the adhesive layer has a viscosity of between about 18 Pa·s and about 140 Pa·s and particularly between about 30 Pa·s and about 100 Pa·s at 25° C. and shear rate 1 sec$^{-1}$.

The adhesive composition has a displacement creep of about 0.1 radians or less when a stress of 10 Pa is applied to the adhesive for 2 minutes. In general, displacement creep is a value determined by using an AR2000 Rheometer manufactured by TA Instruments and a 40 mm diameter×1° cone at 25° C., and is defined as the rotational angle of the cone when a stress of 10 Pa is applied to the adhesive. The displacement creep is related to the ability of the thixotropic adhesive layer to resist flow, or sag, under very low stress conditions, such as gravity and surface tension.

In some embodiments, the liquid optically clear adhesive has a delta of 45 degrees or less, particularly 42 or less, particularly 35 degrees or less and more particularly 30 degrees or less when a torque of 80 microN·m is applied at a frequency of 1 Hz in a cone and plate rheometer. Delta is the phase lag between stress and strain where an oscillatory force (stress) is applied to a material and the resulting displacement (strain) is measured. Delta is assigned units of degrees. The delta is related to the "solid" behavior of the thixotropic adhesive layer or its non-sag property at very low oscillatory stress.

The adhesive layer also has the ability to regain its non-sag structure within a short amount of time after passing underneath equipment, such as a squeegee in stencil printing applications. In one embodiment, the recovery time of the adhesive layer is less than about 60 seconds, particularly less than about 30 seconds, and more particularly less than about 10 seconds to reach a delta of 35 degrees after a torque of about 1000 microN·m is applied for about 60 seconds at a frequency of 1 Hz and immediately followed by a torque of 80 microN·m at a frequency of 1 Hz.

Non-sag adhesive compositions may include filler particles known to produce thixotropic behavior. Suitable fillers according to the present disclosure include clays, a variety of forms of silica and aluminum oxide depending upon particle size and surface treatment, and organic fillers such as cellulose, castor-oil wax, and polyamide-containing fillers. Particulate fillers imparting thixotropy include, but are not limited to: fumed silica, fumed aluminum oxide and clay. Examples of suitable fumed silicas include, but are not limited to: AEROSIL 200; and AEROSIL R805 (both available from Evonic Industries); CAB-O-SIL TS 610; and CAB-O-SIL T 5720 (both available from Cabot Corp.), and HDK H2ORH available from Wacker Chemie AG. An example of a suitable fumed aluminium oxide include, but is not limited to, AEROXIDE ALU 130 (available from Evonik, Parsippany, N.J.). An example of a suitable clay includes, but is not limited to, GARAMITE 1958, available from Southern Clay Products. Fumed silicas generally represent the most preferred fillers although this is somewhat formulation dependent. The adhesive 116 may comprise from about 2 to about 10 wt. % and particularly from about 3.5 to about 7 wt. %, of the thixotropic material.

In some embodiments, the adhesive composition includes non-reactive oligomeric rheology modifiers. While not wishing to be bound by theory, non-reactive oligomeric rheology modifiers build viscosity at low shear rates through hydrogen bonding or other self-associating mechanisms. Examples of suitable non-reactive oligomeric rheology modifiers include, but are not limited to: polyhydroxycarboxylic acid amides (such as BYK 405, available from Byk-ChemieGmbH, Wesel, Germany), polyhydroxycarboxylic acid esters (such as BYK R-606, available from Byk-Chemie GmbH, Wesel, Germany), modified ureas (such as DISPARLON 6100, DISPARLON 6200 or DISPARLON 6500 from King Industries, Norwalk, Conn. or BYK 410 from Byk-Chemie GmbH, Wesel, Germany), metal sulfonates (such as K-STAY 501 from King Industries, Norwalk, Conn. or IRCOGEL 903 from Lubrizol Advanced Materials, Cleveland, Ohio), acrylated oligoamines (such as GENOMER 5275 from Rahn USA Corp, Aurora, Ill.), polyacrylic acids (such as CARBOPOL 1620 from Lubrizol Advanced Materials, Cleveland, Ohio), modified urethanes (such as K-STAY 740 from King Industries, Norwalk, Conn.), or polyamides. In some embodiments, non-reactive oligomeric rheology modifiers are chosen to be miscible and compatible with the optically clear adhesive to limit phase separation and minimize haze.

Optimum rheological performance occurs with proper dispersion of the filler. The mixing shear conditions during the addition of the filler to the other adhesive components may effect the dispersion of the filler. High shear mixing can permanently disrupt the network structure of the thixotropic particles with resultant loss of shape by increased sagging of dispensed adhesive beads. Low-shear mixing may reduce this problem and is preferred for preparing formulations according to the present disclosure.

An adhesive layer is formed on the first substrate 104 by curing the adhesive composition. The adhesive layer is optically clear. As used herein, "optically clear," when used with reference to the first or second substrate or with reference to the adhesive layer means generally that the article has at least 85%, particularly at least 90% transmission over the range of from about 400 nm to about 720 nm, and more particularly at least 92% transmission over the range of from about 400 nm to about 720 nm In one embodiment, the adhesive layer has a transmission of greater than about 85% at 460 nm, greater than about 90% at 530 nm, and greater than 90% at 670 nm as measured by a spectrophotometer or other device capable of measuring percent transmittance. These transmission characteristics provide for uniform transmission of light across the visible region of the electromagnetic spectrum which is important to maintain the color point in full color displays.

The color portion of the transparency characteristics of the first and second substrates (i.e. 104, 102) and or of the adhesive layer is defined by its color coordinates as represented by the L*a*b* convention. For example, the b* component of color should be less than about 1, more preferably less than about 0.5. These characteristics of b* provide for a low yellowness index which is important to maintain the color point in full color displays.

The haze portion of the transparency characteristics of the adhesive layer is defined by the percent haze value of the adhesive layer as measured by haze meters such as a HazeGard Plus available from Byk Gardner or an UltraScan Pro available from Hunter Labs. The optically clear article preferably has haze of the of less than about 5%, preferably less than about 2%, most preferably less than about 1%. These haze characteristics provide for low light scattering which is important to maintain the quality of the output in full color displays.

The adhesive composition and the resulting adhesive layer is made optically clear through the proper choice of adhesive components including oligomers, diluting monomers, fillers, plasticizers, tackifying resins, photoinitiators and any other component which contributes to the overall properties of the adhesive. It is preferred that the adhesive components be compatible with each other, for example they should not phase separate before or after cure. In addition, the adhesive components should generally be free of particles that do not dissolve in the adhesive formulation and are large enough to scatter light, and thereby contribute to haze. However, if haze is desired, such as in diffuse adhesive applications, this may be acceptable. In addition, various fillers such as thixotropic materials should be well dispersed so that they do not contribute to phase separation or light scattering which can contribute to a loss of light transmission and an increase in haze. Again, if haze is desired, such as in diffuse adhesive applications, this may be acceptable. It is preferred that these adhesive components do not degrade the color characteristics of transparency by, for example, imparting color or increasing the b* or yellowness index of the adhesive layer.

The adhesive layer preferably has a refractive index that matches or closely matches that of the substrates to which it is in contact with. The refractive index of the adhesive layer can be controlled by the proper choice of adhesive components. For example, the refractive index can be increased by incorporating oligomers, diluting monomers and the like which contain a higher content of aromatic structure or incorporate sulfur or halogens such as bromine. Conversely the refractive index can be adjusted to lower values by incorporating oligomer, diluting monomers and the like that contain a higher content of aliphatic structure.

The adhesive layer may have any thickness. The particular thickness employed may be determined by any number of factors, for example, the design of the optical device in which the optical assembly is used may require a certain gap between the display panel and the substantially transparent substrate. In one embodiment, the adhesive layer has a thickness 30 of from about 1 µm to about 5 mm, from about 50 µm to about 1 mm, or from about 50 µm to about 0.2 mm.

The adhesive layer may be made using a liquid optically clear adhesive or liquid composition in combination with a thixotrope, wherein the liquid composition has a viscosity suitable for efficient manufacturing of large optical assemblies. A large optical assembly may have an area of from about 15 cm$^2$ to about 5 m$^2$ or from about 15 cm$^2$ to about 1 m$^2$. For example, the liquid composition may have a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$. The liquid composition is amenable for use in a variety of manufacturing methods.

The adhesive layer can include any liquid optically clear adhesive having a viscosity such that when combined with a thixotrope, the adhesive layer has a viscosity of no more than 30 Pa·s, or between about 2 and about 30 Pa·s, or more particularly between about 5 and about 20 Pa·s at a shear rate of 1 to 10 sec$^{-1}$. This range at 1-10 sec$^{-1}$ governs the ability of the adhesive layer to flow underneath a squeegee used during, for example, stencil printing, such that the adhesive layer does not adhere to the squeegee at higher squeegee speeds. In addition this viscosity is low enough to fill the cavity of the stencil with fluid without entrapping air bubbles or having insufficient flow to fill the cavity completely with liquid adhesive fluid. The range of 1-10 sec$^{-1}$ governs the ability of the adhesive layer to flow underneath a squeegee at slower speeds. At 1 sec$^{-1}$, the adhesive layer had a viscosity of between about 18 and about 140 Pa·s. At 0.01 sec$^{-1}$, the adhesive layer has a viscosity of at least 700 Pa·s, at least 2,000 Pa·s and preferably at least 10,000 Pa·s. The range at 0.01 sec$^{-1}$ defines when the adhesive layer has non-sag properties.

In one embodiment, the liquid optically clear adhesive used in the adhesive layer has a viscosity of about 20 Pa·s or less at a shear rate of 1-10 sec$^{-1}$. In particular, the liquid optically clear adhesive has a viscosity of about 10 Pa·s or less and more particularly about 5 Pa·s or less at a shear rate of 1-10 sec-1. Within these ranges, the viscosity of the adhesive layer will be in the appropriate range when a thixothrope is added.

The adhesive layer may comprise non-absorbing metal oxide particles, for example, to modify the refractive index of the adhesive layer or the viscosity of the liquid adhesive composition (as described below). Non-absorbing metal oxide particles that are substantially transparent may be used. For example, a 1 mm thick disk of the non-absorbing metal oxide particles in an adhesive layer may absorb less than about 15% of the light incident on the disk. Examples of non-absorbing metal oxide particles include clay, $Al_2O_3$, $ZrO_2$, $TiO_2$, $V_2O_5$, ZnO, $SnO_2$, ZnS, $SiO_2$, and mixtures thereof, as well as other sufficiently transparent non-oxide ceramic materials. Non-absorbing metal oxide particles may be used in an amount needed to produce the desired effect, for example, in an amount of from about 2 to about 10 wt. %, from about 3.5 to about 7 wt. %, from about 10 to about 85 wt. %, or from about 40 to about 85 wt. %, based on the total weight of the adhesive layer. Non-absorbing metal oxide particles may only be added to the extent that they do not add undesirable color, haze or transmission characteristics. Generally, the particles can have an average particle size of from about 1 nm to about 100 nm. The metal oxide particles can be surface treated to improve dispersibility in the adhesive layer and the composition from which the layer is coated. Examples of surface treatment chemistries include silanes, siloxanes, carboxylic acids, phosphonic acids, zirconates, titanates, and the like. Techniques for applying such surface treatment chemistries are known. Organic fillers such as cellulose, castor-oil wax and polyamide-containing fillers may also be used.

The adhesive composition should also exhibit very low to no bubbling during the dispensing, drawdown, and lamination steps involved in bonding the second substrate 102 to the lower surface substrate 104. This is particularly important if the bonding process is done under negative pressure (or vacuum), so-called vacuum lamination. Such vacuums can range from 200 Pa to 5000 Pa. At such vacuum environment, vacuum evaporation of the adhesive composition may take place leading to undesirable bubble formation. The adhesive composition may have a vapour pressure of less than about 1 mm Hg (133 Pa) at 20° C., more preferably less than 0.2 mm Hg (26.7 Pa) at 20° C., in order to prevent excessive loss of mass or bubbling during the vacuum lamination process. This is achievable by selecting additives to the adhesive 116 which in themselves have a vapour pressure of less than about 1 mm Hg (133 Pa) at 20° C., more preferably less than 0.2 mm Hg (26.7 Pa) at 20° C. In addition, in order to prevent excessive loss of mass during the vacuum lamination process, the weight loss of adhesive 116 should be less than about 0.05 wt % after 2 minutes at 2000 Pa and 25° C., preferably less than 0.03 wt % after 2 minutes at 2000 Pa and 25° C.

In general, (meth)acrylate refers to both acrylate and methacrylate functionality.

Furthermore, the adhesive composition may include the reaction product of a multifunctional (meth)acrylate oligomer, and a reactive diluent comprising a monofunctional (meth)acrylate monomer having a viscosity of from about 4 to about 20 cps at 25° C.; a plasticizer, and optionally a tackifying resin.

The multifunctional (meth)acrylate oligomer may comprise any one or more of: a multifunctional urethane (meth) acrylate oligomer, a multifunctional polyester (meth)acrylate oligomer, and a multifunctional polyether (meth) acrylate oligomer. The multifunctional (meth)acrylate oligomer may comprise at least two (meth)acrylate groups, e.g., from 2 to 4 (meth)acrylate groups, that participate in polymerization during curing. The adhesive layer may comprise from about 15 to about 50 wt. %, or from about 20 to about 45 wt. %, of the multifunctional (meth)acrylate oligomer. The particular multifunctional (meth)acrylate oligomer used, as well as the amount used, may depend on a variety of factors. For example, the particular oligomer and/or the amount thereof may be selected such that the adhesive composition is a liquid composition having a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$. For another example, the particular oligomer and/or the amount thereof may be selected such that the adhesive composition is a liquid composition having a viscosity of from about 100 to 140,000 cps, from about 100 to 20 about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$ and the resulting adhesive layer has a Shore A hardness of less than about 30, less than about 20 or less than about 10. For yet another example, the particular oligomer and/or the amount thereof may be selected such that the adhesive composition is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate 0.01 sec$^{-1}$.

The multifunctional (meth)acrylate oligomer may comprise a multifunctional urethane (meth)acrylate oligomer having at least two (meth)acrylate groups, e.g., from 2 to 4 (meth)acrylate groups, that participate in polymerization during curing. In general, these oligomers comprise the reaction product of a polyol with a multifunctional isocyanate, followed by termination with a hydroxy-functionalized (meth)acrylate. For example, the multifunctional urethane (meth)acrylate oligomer may be formed from an aliphatic polyester or polyether polyol prepared from condensation of a dicarboxylic acid, e.g., adipic acid or maleic acid, and an aliphatic diol, e.g. diethylene glycol or 1,6-hexane diol. For instance, the polyester polyol may comprise adipic acid and diethylene glycol. The multifunctional isocyanate may comprise methylene dicyclohexylisocyanate or 1,6-hexamethylene diisocyanate. The hydroxy-functionalized (meth)acrylate may comprise a hydroxyalkyl (meth)acrylate such as 2-hydroxyethyl acrylate, 2-hydroxypropyl (meth)acrylate, 4-hydroxybutyl acrylate, or polyethylene glycol (meth)acrylate. As an example, the multifunctional urethane (meth) acrylate oligomer may comprise the reaction product of a polyester polyol, methylene dicyclohexylisocyanate, and hydroxyethyl acrylate.

Useful multifunctional urethane (meth)acrylate oligomers include products that are commercially available. For example, the multifunctional aliphatic urethane (meth)acrylate oligomer may comprise urethane diacrylate CN9018, CN3108, and CN3211 available from Sartomer, Co., Exton, Pa., Genomer 4188/EHA (blend of Genomer 4188 with 2-ethylhexyl acrylate), Genomer 4188/M22 (blend of Genomer 4188 with Genomer 1122 monomer), Genomer 4256, and Genomer 4269/M22 (blend of Genomer 4269 and Genomer 1122 monomer) available from Rahn USA Corp., Aurora Ill., U-Pica 8966A and U-Pica 8967A available from Japan U-Pica Corp., and polyether urethane diacrylate BR-3042, BR-3641AA, BR-3741AB, and BR-344 available from Bomar Specialties Co., Torrington, Conn.

In general, the multifunctional urethane (meth)acrylate oligomer may be used in any amount depending on other components used to form the adhesive layer as well as the desired properties of the adhesive layer. The adhesive layer may comprise from about 15 to about 50 wt. %, or from about 20 to about 45 wt. %, of the multifunctional urethane (meth)acrylate oligomer.

The multifunctional (meth)acrylate oligomer may comprise a multifunctional polyester (meth)acrylate oligomer. Useful multifunctional polyester acrylate oligomers include products that are commercially available. For example, the multifunctional polyester acrylate may comprise BE-211 available from Bomar Specialties Co. and CN2255 available from Sartomer Co.

The multifunctional (meth)acrylate oligomer may comprise a multifunctional polyether (meth)acrylate oligomer. Useful multifunctional polyether acrylate oligomers include products that are commercially available. For example, the multifunctional polyether acrylate may comprise Genomer 3414 available from Rahn USA Corp.

The reaction product that forms the adhesive layer is formed from a reactive diluent. The reactive diluent comprises a monofunctional (meth)acrylate monomer having a viscosity of from about 4 to about 20 cps at 25° C. The reactive diluent may comprise more than one monomer, for example, from 2-5 different monomers. Examples of these monomers include lauryl acrylate, isobornyl acrylate, isobornyl (meth)acrylate, tetrahydrofurfuryl acrylate, tetrahydrofurfuryl methacrylate, alkoxylated tetrahydrofurfuryl acrylate, and mixtures thereof. For example, the reactive diluent may comprise tetrahydrofurfuryl (meth)acrylate and isobornyl (meth)acrylate. For another example, the reactive diluent may comprise alkoxylated tetrahydrofurfuryl acrylate and isobornyl acrylate. For another example, the reactive diluent may comprise lauryl acrylate and isobornyl acrylate.

In general, the reactive diluent may be used in any amount depending on other components used to form the adhesive layer as well as the desired properties of the adhesive layer. The adhesive layer may comprise from about 15 to about 50 wt. %, or from about 20 to about 50 wt. %, of the reactive diluent, relative to the total weight of the adhesive layer.

The particular reactive diluent used, and the amount(s) of monomer(s) used, may depend on a variety of factors. For example, the particular monomer(s) and amount(s) thereof may be selected such that the adhesive composition is a liquid composition having a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$. For another example, the particular monomer(s) and amount(s) thereof may be selected such that the adhesive composition is a liquid composition having a viscosity of from about 100 to 140,000 cps, from about 100 to 20 about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$ and the resulting adhesive layer has a Shore A hardness of less than about 30, less than about 20 or less than about 10. For yet another example, the particular diluent and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

The adhesive layer comprises a plasticizer that increases its softness and flexibility. Plasticizers are well known and typically do not participate in polymerization of (meth) acrylate groups. The plasticizer may comprise more than one plasticizer material. The plasticizer may comprise an oil. Suitable oils include vegetable oil, mineral oil and soybean oil. The adhesive layer may comprise from greater than 5 to about 20 wt. % or from greater than 5 to about 15 wt. %, of the plasticizer. The particular plasticizer used, as well as the amount used, may depend on a variety of factors. For example, the particular plasticizer used and/or the amount thereof may be selected such that the adhesive composition is a liquid composition having a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$. For another example, the particular plasticizer and/or the amount thereof may be selected such that the adhesive composition is a liquid composition having a viscosity of from about 100 to 140,000 cps, from about 100 to 20 about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$ and the resulting adhesive layer has a Shore A hardness of less than about 30, less than about 20 or less than about 10. For yet another example, the particular plasticizer and/or the amount thereof may be selected such that the adhesive composition is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

The reaction product that forms the adhesive layer may further comprise a monofunctional (meth)acrylate monomer having alkylene oxide functionality. This monofunctional (meth)acrylate monomer having alkylene oxide functionality may comprise more than one monomer. Alkylene functionality includes ethylene glycol and propylene glycol. The glycol functionality is comprised of units, and the monomer may have anywhere from 1 to 10 alkylene oxide units, from 1 to 8 alkylene oxide units, or from 4 to 6 alkylene oxide units. The monofunctional (meth)acrylate monomer having alkylene oxide functionality may comprise propylene glycol monoacrylate available as Bisomer PPA6 from Cognis Ltd. This monomer has 6 propylene glycol units. The monofunctional (meth)acrylate monomer having alkylene oxide functionality may comprise ethylene glycol monomethacrylate available as Bisomer MPEG350MA from Cognis Ltd. This monomer has on average 7.5 ethylene glycol units.

The adhesive layer may comprise from about 5 to about 30 wt. %, or from about 10 to about 20 wt. %, of the monofunctional (meth)acrylate monomer having alkylene oxide functionality. The particular monomer used, as well as the amount used, may depend on a variety of factors. For example, the particular monomer used, as well as the amount used, may be selected such that the adhesive composition is a liquid composition having a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$. For another example, the particular monomer used, as well as the amount used, may be selected such that the adhesive composition is a liquid composition having a viscosity of from about 100 to 140,000 cps, from about 100 to 20 about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$ and the resulting adhesive layer has a Shore A hardness of less than about 30, less than about 20 or less than about 10. For example, the particular monomer and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

The adhesive layer may comprise tackifier. Tackifiers are typically used to increase the tackiness or other properties of the adhesive. Preferred tackifiers include a rosin resin derived from wood rosin, gum rosin or tall oil rosin; a hydrocarbon resin made from a petroleum based feedstock; or a terpene resin derived from terpene feedstocks of wood or certain fruits. The adhesive layer may comprise, e.g., from 0.01 to about 30 wt. %, from 5 to about 25 wt. %, or from 10 to about 20 wt. % of tackifier. The adhesive layer may be substantially free of tackifier comprising, e.g., from 0.01 to about 5 wt. % or from about 0.01 to about 0.5 wt. % of tackifier all relative to the total weight of the adhesive layer. The adhesive layer may be free of tackifier. The particular tackifier used, as well as the amount used, may depend on a variety of factors. The tackifier and/or the amount thereof may be selected such that the adhesive layer has a cleavage strength between glass substrates of about 15 N/mm or less, 10 N/mm or less, or 6 N/mm or less. The particular tackifier and/or the amount thereof may be selected such that the adhesive composition is a liquid composition having a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$. For another example, the particular tackifier and/or the amount thereof may be selected such that the adhesive composition is a liquid composition having a viscosity of from about 100 to 140,000 cps, from about 100 to about 10,000 cps, from about 100 to about 5000 cps, from about 100 to about 1000 cps, from about 200 to about 700 cps, from about 200 to about 500 cps, or from about 500 to about 4000 cps, wherein viscosity is measured for the composition at 25° C. and 1 sec$^{-1}$ and the resulting adhesive layer has a Shore A hardness of less than about 30 less than about 20 or less than about 10. For yet another example, the particular tackifier and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

In one embodiment, the adhesive layer may include the reaction product of from about 15 to about 50 wt. % of the multifunctional (meth)acrylate oligomer, from about 15 to about 50 wt. % of the reactive diluents, from greater than 5 to about 25 wt. % of the plasticizer and from 0 to about 10 wt. % of a filler particle. The reaction product may further comprise from about 10 to about 20 wt. % of a monofunctional (meth)acrylate monomer having alkylene oxide functionality. The particular components used, as well as the amount used, may depend on a variety of factors. For example, these components and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$. This adhesive layer may comprise a glass-t-glass cleavage force less than about 15 N/mm, less than about 10 N/mm, or less than about 6 N/mm.

In another embodiment, the adhesive layer may include the reaction product of from about 20 to about 60 wt. % of the multifunctional (meth)acrylate oligomer, from about 30 to about 60 wt. % of the reactive diluents, and from greater than 5 to about 25 wt. % of the plasticizer. The reaction product may further comprise from about 10 to about 20 wt. % of a monofunctional (meth)acrylate monomer having alkylene oxide functionality. This adhesive layer may comprise a glass-t-glass cleavage force less than about 15 N/mm, less than about 10 N/mm, or less than about 6 N/mm.

In another embodiment, the adhesive layer may include the reaction product of from about 25 to about 45 wt. % of the multifunctional (meth)acrylate oligomer, from about 40 to about 60 wt. % of the reactive diluents, from greater than 5 to about 15 wt. % of the plasticizer and from 0 to about 10 wt. % of a filler particle. The reaction product may further comprise from about 10 to about 20 wt. % of a monofunctional (meth)acrylate monomer having alkylene oxide functionality. For example, these components and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

In another embodiment, the adhesive layer may include the reaction product of from about 20 to about 50 wt. % of the multifunctional urethane (meth)acrylate oligomer, from about 30 to about 60 wt. % of the reactive diluents, from greater than 5 to about 25 wt. % of the plasticizer and from 0 to about 10 wt. % of a filler particle. The reaction product may further comprise from about 10 to about 20 wt. % of a monofunctional (meth)acrylate monomer having alkylene oxide functionality. For example, these components and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

In another embodiment, the adhesive layer may include the reaction product of from about 25 to about 45 wt. % of the multifunctional urethane (meth)acrylate oligomer, from about 40 to about 60 wt. % of the reactive diluents, from greater than 5 to about 15 wt. % of the plasticizer and from 0 to about 10 wt. % of a filler particle. The reaction product may further comprise from about 10 to about 20 wt. % of a monofunctional (meth)acrylate monomer having alkylene oxide functionality. For example, these components and/or the amount thereof may be selected such that the composition of the adhesive 116 is a liquid composition having a viscosity of 18 Pa·s to 140 Pa·s at 25° C. and a shear rate of 1 sec$^{-1}$ and a viscosity of 700 Pa·s to 4200 Pa·s at 25° C. and a shear rate of 0.01 sec$^{-1}$.

In another embodiment, the adhesive layer may include the reaction product of from about 30 to about 60 wt. % of the multifunctional urethane (meth)acrylate oligomer, from about 20 to about 30 wt. % of the reactive diluents, from greater than 5 to about 10 wt. % of the plasticizer, from about 5 to about 10 wt. % of a monofunctional (meth) acrylate monomer having alkylene oxide functionality, and from about 2 to about 10 wt. % of fumed silica.

In another embodiment, the adhesive 116 may include the reaction product of a multifunctional rubber-based (meth) acrylate oligomer, a monofunctional (meth)acrylate monomer having a pendant alkyl group of from 4 to 20 carbon atoms, and a liquid rubber.

The multifunctional rubber-based (meth)acrylate oligomer may include any one or more of: a multifunctional polybutadiene (meth)acrylate oligomer, a multifunctional isoprene (meth)acrylate oligomer, and a multifunctional (meth)acrylate oligomer comprising a copolymer of butadiene and isoprene. The multifunctional rubber-based (meth) acrylate oligomer may include a multifunctional polybutadiene (meth)acrylate oligomer. The monofunctional (meth) acrylate monomer having a pendant alkyl group of from 4 to 20 carbon atoms may include a pendant group having from 8 to 20 carbon atoms. The liquid rubber may include liquid isoprene.

Useful multifunctional polybutadiene (meth)acrylate oligomers include, but is are not limited to, the difunctional polybutadiene (meth)acrylate oligomer CN307 and CN307 available from Sartomer Co. Useful multifunctional polyisoprene (meth)acrylate oligomers include, but are not limited to, the methacrylated isoprene oligomers UC-102 and UC-203 available from Kuraray America, Inc.

Useful monofunctional (meth)acrylate monomers having pendant alkyl groups of from 4 to 20 carbon atoms include, but are not limited to, 2-ethylhexyl acrylate, lauryl acrylate, isodecyl acrylate, and stearyl acrylate.

Liquid rubber may include, but are not limited to, LIR-30 liquid isoprene rubber and LIR-390 liquid butadiene/isoprene copolymer rubber available from Kuraray, Inc. and Ricon 130 liquid polybutadiene rubber available from Sartomer Co., Inc.

The adhesive layer may further include a plasticizer as described above.

In another embodiment, the adhesive layer may include the reaction product of from about 20 to about 60 wt. % of the multifunctional rubber-based (meth)acrylate oligomer, from about 20 to about 60 wt. % of the monofunctional (meth)acrylate monomer having a pendant alkyl group of from 4 to 20 carbon atoms, and from greater than 5 to about 25 wt. % of the liquid rubber.

In another embodiment, the adhesive layer may include the reaction product of from about 20 to about 50 wt. % of the multifunctional rubber-based (meth)acrylate oligomer, from about 20 to about 50 wt. % of the monofunctional (meth)acrylate monomer having a pendant alkyl group of from 4 to 20 carbon atoms, from greater than 5 to about 25 wt. % of the liquid rubber, and from 2 to about 10 wt. % of a filler particle.

The adhesive layer may be soft, for example, the layer may have a Shore A hardness of less than about 30, less than about 20 or less than about 10. The adhesive layer may exhibit little or no shrinkage, e.g., less than about 5%, depending on whatever amount is acceptable. In another embodiment, the adhesive may be silicone based. For example the adhesive may be using addition curing chemistry between a silicon hydride functional silicone and a vinyl or allyl functional silicone. Addition curing silicones are well known in the art and they often incorporate platinum based catalysts that can be activated by heat or UV irradiation. Likewise, two-component silicone liquid adhesives or gel forming materials may be used as the basis for this thixotropic, printable material. These types of silicones may rely on condensation chemistry and require heat to accelerate the curing mechanism.

Photoinitiators may be used in the liquid compositions when curing with UV-radiation. Photoinitiators include organic peroxides, azo compounds, quinines, nitro compounds, acyl halides, hydrazones, mercapto compounds, pyrylium compounds, imidazoles, chlorotriazines, benzoin, benzoin alkyl ethers, ketones, phenones, and the like. For example, the adhesive compositions may comprise ethyl-2,4,6-trimethylbenzoylphenylphosphinate available as LUCIRIN TPO-L from BASF Corp. or 1-hydroxycyclohexyl phenyl ketone available as IRGACURE 184 from Ciba Specialty Chemicals. The photoinitiator is often used at a concentration of about 0.1 to 10 weight percent or 0.1 to 5 weight percent based on the weight of oligomeric and monomer material in the polymerizable composition.

The liquid compositions and adhesive layers described above can optionally include one or more additives such as chain transfer agents, antioxidants, stabilizers, fire retardants, viscosity modifying agents, antifoaming agents, antistats, wetting agents, colorants such as dyes and pigments, fluorescent dyes and pigments, phosphorescent dyes and pigments, fibrous reinforcing agents, and woven and nonwoven fabrics.

As previously described, the adhesive layer is formed by curing the adhesive 116. Any form of electromagnetic radiation may be used to cure the adhesive 116. For example, the adhesive 116 may be cured using UV-radiation and/or heat. Electron beam radiation may also be used. The liquid compositions described above may be cured using actinic radiation, i.e., radiation that leads to the production of photochemical activity. For example, actinic radiation may comprise radiation of from about 250 to about 700 nm. Sources of actinic radiation include tungsten halogen lamps, xenon and mercury arc lamps, incandescent lamps, germicidal lamps, fluorescent lamps, lasers and light emitting diodes. UV-radiation can be supplied using a high intensity continuously emitting system such as those available from Fusion UV Systems.

Furthermore, actinic radiation may be applied to a layer of the adhesive composition such that the composition is partially polymerized. The adhesive composition may be disposed between the substrates and then partially polymerized. The adhesive composition may be disposed on the first substrate or second substrate and partially polymerized, then the other of the other substrate may be disposed on the partially polymerized layer.

Moreover, actinic radiation may be applied to a layer of the adhesive composition such that the composition is completely or nearly completely polymerized. The adhesive composition may be disposed between the substrates and then completely or nearly completely polymerized. The adhesive composition may be disposed on the first substrate or second substrate and completely or nearly completely polymerized, then the other substrate may be disposed on the polymerized layer.

Two illustrative examples of non-sagging adhesive compositions are described here. Thixotropic liquid optically clear adhesives were prepared by adding the components in Table 2 to white mixing containers, a Max 300 (about 500 cm³), from FlackTek Inc., Landrum, S.C., and mixed using a Hauschild Speedmixer™ DAC 600 FV, from FlackTek Inc., operating at 2200 rpm. After mixing for 4 minutes, the sides of the containers were scraped down to make sure all the fumed silica was incorporated, then the containers were mixed for an additional 4 minutes.

TABLE 2

| Component | Ex. 1 Mass (grams) | Ex. 2 Mass (grams) |
| --- | --- | --- |
| U-Pica 8967A | 34.2 | 16.3 |
| U-Pica 8966A | 0 | 12.5 |
| Joncryl 960 | 0 | 27 |
| KE311 | 11.4 | 19.5 |
| CD611 | 12.3 | 0 |
| SR506A | 17.1 | 19.5 |
| Bisomer PPA6 | 9.5 | 0 |
| Soybean oil | 9.5 | 0 |
| A187 | 0 | 0.2 |
| TPO-L | 1 | 0 |
| Darocur 4265 | 0 | 2 |
| Aerosil A200 | 5 | 0 |
| Aerosil R805 | 0 | 6 |

The viscosities of Examples 1 and 2 were measured as in Example 1 and reported in Table 3. The thixotropy was considered good if it had a viscosity of 18 Pa·s to 140 Pa·s at a shear rate of 1 sec$^{-1}$ and a viscosity of 700 Pa·s to 4200 Pa·s. at 0.01 sec$^{-1}$.

Examples 1 and 2 were each sandwiched between 2"×3" microscope slides at a thickness of about 200 microns and cured using a 300 W/inch Fusion H bulb and a UVA energy of 3000 mJ/cm² as measured by a UV Power Puck (EIT, Inc., Sterling, Va. Haze was measured using a HazeGard Plus (BYK-Gardner USA, Columbia, Md.). The values for haze are reported in Table 3. The cured adhesive was considered good if the haze was <1%.

TABLE 3

| | Ex. 1 | Ex. 2 |
| --- | --- | --- |
| Viscosity (Pa · s) Shear rate 0.01 sec$^{-1}$ | 1480 | 974 |
| Viscosity (Pa · s) Shear rate 0.1 sec$^{-1}$ | 613 | 185 |
| Viscosity (Pa · s) Shear rate 1 sec$^{-1}$ | 91 | 55.6 |
| Thixotropy result | good | good |
| Haze | 0.4% | 0.7% |
| Haze result | good | good |
| Weight Loss | 0.033% | NA |

The materials used in Examples 1 and 2 are further explained in Table 4 below.

TABLE 4

| Abbreviation or Trade Name | Description |
| --- | --- |
| U-PICA 8967A | Urethane acrylate oligomer (Japan U-Pica Corp) |
| U-PICA 8966A | Urethane acrylate oligomer (Japan U-Pica Corp) |
| CD611 | Alkoxylated tetrahydrofuranyl Acrylate (Sartomer Co., Exton, PA) |
| SR506A | Isobornyl acrylate (Sartomer Co., Exton, PA) |
| TPO-L | Ethyl-2,4,6-trimethylbenzoylphenylphosphinate, photoinitiator (BASF Corp., Florham Park, NJ) |
| DAROCUR 4265 | 50% DAROCUR 1173 (2-Hydroxy-2-methyl-1-phenyl-propan-1-one); and 50% TPO (2,4,6-Tri- |

TABLE 4-continued

| Abbreviation or Trade Name | Description |
|---|---|
| | methylbenzoyl-diphenyl-phosphineoxide) (BASF Corp.) |
| BISOMER PPA6 | Polypropylene glycol monoacrylate (Cognis Ltd., Southampton, UK) |
| JONCRYL 960 | Acrylic oligomer (BASF Corp.) |
| KE311 | Rosin ester (Arakawa Chemical Ind., Ltd., Osaka, Japan) |
| Soybean oil | Plasticizer (Sigma-Aldrich Chem. Co., St. Louis, MO) |
| Aerosil A200 | Fumed silica (Evonik Industries, Parsippany, NJ) |
| Aerosil R805 | Fumed silica (Evonik Industries, Parsippany, NJ) |

With reference to FIGS. 1 to 8 and FIG. 9, an example of the steps of a method of lamination of the present invention to bond the second substrate 102 and the first substrate 104 is described as follows.

At step 902, the first substrate 104 is automatically placed by machinery or manually by hand at a location for adhesive application.

At step 904, a protective layer of the first substrate 104 is peeled off. The protective layer may be peeled off by hand or automatically by machinery.

At step 906, a stencil 202 is laid onto the first substrate 104 automatically by machinery or manually by hand. Areas covered by the stencil 202 would not be printed with adhesive 116.

At step 908, application of adhesive 116 (or in other words, the adhesive composition of adhesive 116) via printing methodologies on the first substrate 104 commences. The stencil 202 is removed after adhesive 116 is printed. The thickness of the printed adhesive 116 may range from 0.025 mm to 2 mm.

At step 910, the first substrate 104 applied with adhesive 116 is automatically placed by machinery or manually placed by hand onto the holding mechanism 108 in the chamber 100 with the surface applied with adhesive 116 facing upwards. At step 914, a protective layer 116 of the second substrate 102 is peeled off.

At step 916, the second substrate 102 is automatically placed by machinery or manually by hand at a location for holding by the holding mechanism 106. The surface of the second substrate 102 to be bonded with the first substrate 104 faces downwards.

It is appreciated that steps 902 to 910 and steps 914 and 916 may commence concurrently or sequentially.

At step 912, vision marks of the first substrate 104 and the second substrate 102 are checked. Vision marks could be physical markings deliberately marked on the substrates 102, 104 or they could be distinct features of the substrates 102, 104 such as the edges of the substrates 102, 104 etc. that could be captured by cameras residing in the chamber 100 and easily identified via imaging software.

At step 918 the first substrate 104 is aligned with the second substrate 102. One method of automatic alignment via motorized movements is discussed below with reference to FIG. 11.

Misalignments detected via inspection of the vision marks at step 912 are adjusted at step 918 to ensure that the surfaces of the substrates 102, 104 are aligned when they come into contact for bonding in subsequent steps of the lamination process. Ideally, the surface of the first substrate 104 to be bonded should be made planar to or parallel with the surface of the second substrate 102 to be bonded. Also, the surfaces of the substrates 102, 104 to be bonded should match and face each other accurately.

Figure 15:
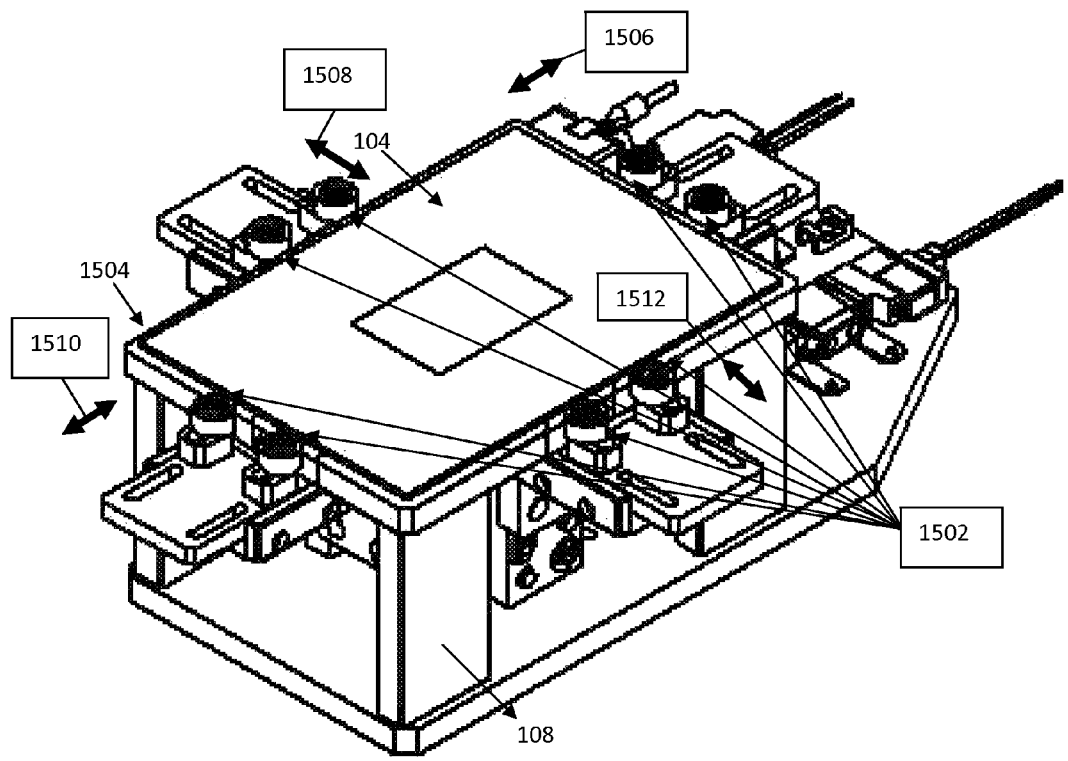
FIG. 15 is a perspective view of a device for forming a panel substrate assembly.

With reference to FIG. 15, for the surfaces of the substrates 102, 104 to be bonded accurately, eight side guides 1502 are used. The side guides 1502 are disposed on the first substrate holding mechanism 108 in the area surrounding the sitting location 1504 of the first substrate 104. Two side guides 1502 are disposed on each of the four sides of the first substrate 104. The side guides 1502 are abutments movable by machinery towards the direction of the first substrate 104 to push the first substrate into position. FIG. 15 shows the directions 1506, 1508, 1510 and 1512 in which the side guides 1502 are movable for the positioning of the first substrate 104. The side guides 1502 can help to achieve alignment tolerances of 0.1 to 0.3 mm in the positioning of the first substrate 104. The actual value of the alignment tolerance depends on the dimensional tolerances of the substrates 102, 104 and of the machine parts of the holding mechanisms 106 and 108 respectively. Said dimensional tolerances refer to the uncontrollable variation in the dimensions of device components/substrates as products of manufacture. It is difficult, if possible at all, to obtain exactly the same product sizes for every product of manufacture in a manufacturing process. This applies to the substrates 102, 104 and the machine parts of the holding mechanisms 106 and 108.

Alignment of the substrates 102, 104 to make the surfaces to be bonded planar involves use of vision cameras to check vision marks and suitable software algorithms to calculate the alignment of the substrates 102, 104. Alignment via use of vision marks will improve positioning accuracy by up to 5 to 50 um.

Figure 10:
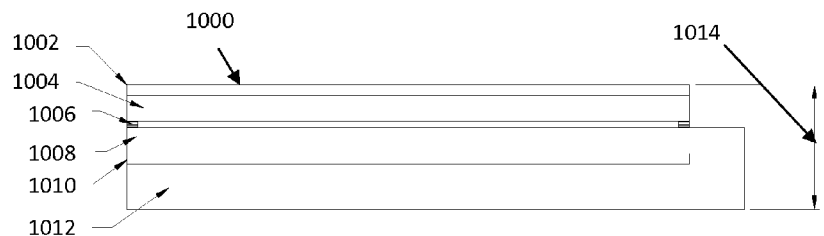
FIG. 10 is a side view of a panel substrate assembly laminated using adhesive.

FIG. 10 illustrates the need for substrate dimensions to be kept within specified tolerances. A product requiring lamination of many layers of substrates could have varying thickness after all the layers are stacked and adhered together. For instance, the display module 1000 in FIG. 10 comprises substrates adhered in a top down order as follows, a first polarizer substrate 1002, a first glass substrate (top) 1004, seal 1006, a second glass substrate (bottom) 1008, a second polarizer substrate 1010, and a light guide 1012. The total thickness 1014 of the display module 1000 may be different, for instance, when measured at the four corners (assuming the display module 1000 is generally rectangular) and from the centre of the display module 1000.

Since absolute consistency of substrate thickness cannot be guaranteed, one would need to find the optimum alignment adjustments to level the substrates 102, 104. For instance, the optimum alignment adjustments could be derived by calculations involving the measurements of the thickness at the four corners of the substrates 102, 104. The measurement of the centre thickness of the substrates 102, 104, may also be included in the calculations.

A method involving use of vision cameras and measurements of thickness of the substrates 102, 104 for making the first substrate 104 planar with the second substrate 102 is described as follows.

Figure 11:
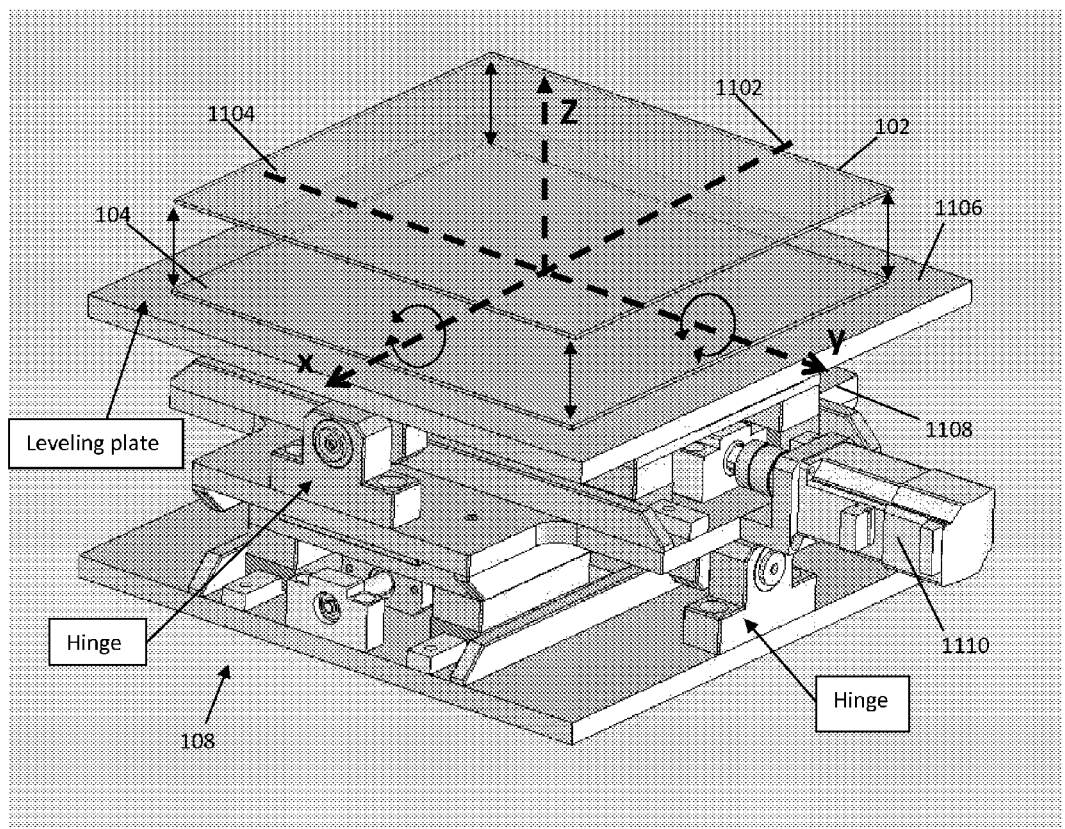
FIG. 11 is a perspective view of a device for forming a panel substrate assembly.

With reference to FIG. 11, the second substrate 102 is taken as a datum or reference and is not adjusted. The first substrate 104 placed on a leveling plate 1106 is adjusted to be made planar to the second substrate 102. Each of the substrates 102, 104 are measured for their thicknesses at their respective four corners and the thickness data are stored. Vision cameras take images of the substrates 102, 104 to capture vision marks on them, for instance, two fiducial markers, or other distinct marks. Position data of the substrates 102, 104 are derived from the captured vision marks.

The holding mechanism 108 that is holding the first substrate 104 comprises a leveling plate 1106, and two servo motor drives 1108 and 1110 for making angular adjustments, i.e. the pitch and roll of the leveling plate 1106. The pitch and roll of the leveling plate 1106 are adjusted about two right angled axes x and y respectively, which are planar to the leveling plate 1106. The z axis is the axis in which the second substrate 102 moves along as it is brought towards the first substrate 104.

A suitable software algorithm is executed to calculate the extent of adjustments to make to the leveling plate 1106 based on position data and thickness data of the substrates 102, 104. The holding mechanism 108 of the first substrate 104 then adjusts the roll and pitch of the plane of the leveling plate 1106 accordingly to level the first substrate 104 with the second substrate 102.

Referring back to FIG. 9, at step 920, the second substrate 102 is moved vertically downwards to the first substrate 108 for bonding in the chamber 100. During the bonding process in the example, the air pressure in the chamber 100 is decreased to a negative pressure, which is below atmospheric pressure and ranging from 0 to 5000 pa. At very low pressures, such as vacuum, vacuum evaporation of the adhesive 116 may take place. However, vacuum evaporation is kept to a minimum due to the inherent properties of the adhesive 116. The lamination process is carried out at a pressure ranging from 0 to 5000 pa so that any undesirable trapped air between the adhered substrates 102, 104 is also at reduced pressure. Hence, when the laminated product or assembly is brought back under normal pressure, the trapped air would be indiscernible to human eyes. For good process yield, the pressure is kept at less than or equal to 5000 pa, or even lower at less than or equal to 2000 pa.

During bonding, it is undesirable to excessively press the adhesive 116 situated between the substrates 102, 104 until the adhesive 116 overflows from the edges of the substrates 102, 104. To prevent excessive pressing, the servo press machine 112 firstly moves the second substrate 102 to a predetermined spacing, e.g. at a spacing of 0.025 mm to 2 mm away from the first substrate 104, at a first speed of about 2 mm/sec to 50 mm/sec.

After bringing the second substrate 102 to the first substrate 104 by the predetermined spacing, the servo press machine 112 continues to bring the second substrate 102 towards the first substrate 104 at a second speed. When brought beyond the predetermined spacing, the second substrate 102 would eventually be in contact with the adhesive 116. The adhesive 116 is evenly spread out as it is pressed by the second substrate 102. Beyond the predetermined spacing, the second speed of the movement of the servo press machine 112 is reduced from the first speed, e.g. the second speed can be 0.05 mm/sec to 1 mm/sec. The reduced speed allows for the adhesive 116 to fully flow to edges of the substrates 102, 104 as it is pressed. The servo press machine 112 will stop moving the second substrate 102 once a predefined distance between the substrates 102, 104 is reached. This predefined distance should be sufficient for the adhesive 116 have fully flowed to the edges of the substrates 102, 104 without overflowing. The predefined distance in the example is about 0.1 mm. It is appreciated that the range of values of the predefined distance could be 0.025 to 2 mm. The dimensional tolerance of the predefined distance is preferably kept at +/−3 um. The predefined distance can be adjusted to achieve close to 0.1 mm based on the dimensional tolerances of the substrates 102, 104 measured at step 918.

In the case where electrostatic chucks or mechanical grippers are used, the vacuum chamber 100 may decrease pressure before the second substrate 102 is brought towards the first substrate 104. However, if vacuum chucks are used, the second substrate holding mechanism 106 would have a problem holding the second substrate 102 in the vacuum environment. The holding pressure of the vacuum chucks will normalize with the vacuum environment, thereby preventing firm holding of the second substrate 102. The solution is to decrease the pressure of the vacuum chamber 100 only after bringing the second substrate 102 close to the predetermined spacing of 0.025 mm to 2 mm away from the first substrate 104. In this manner, when the holding pressure of the vacuum chucks normalizes with the pressure in the vacuum environment, the second substrate 102 would be at the location where it is ready for pressing on the adhesive 116 printed on the first substrate 104 by the servo press machine 112. Even if the second substrate 102 drops onto the first substrate 104 when the holding pressure normalizes, the distance in which it drops would be little and would not cause any irregularities in the arrangement of the adhesive 116 printed on the first substrate 104. It is appreciated that if electrostatic chucks or mechanical grippers are used, there would not be a need to drop the second substrate 102. In this case, the second substrate 102 can be brought into contact with the adhesive 116 spread over on the first substrate 104.

After step 920, there could be some small air bubbles of sizes around 0.5 mm which is of lower than atmospheric pressure type trapped in the adhesive 116 between the two substrates 102, 104.

At step 922, the pressure level in the vacuum chamber 100 is brought back to atmospheric pressure. An air compressor for supplying pressurized air may be included in the machinery of the vacuum chamber 100 to quicken the time in which the vacuum chamber 100 is brought back to atmospheric pressure. As the vacuum chamber 100 is brought back to atmospheric pressure, the trapped air bubbles, if any, within the adhesive 116 will shrink in size preferably so that they are not visible to the naked eye.

At step 924, the laminated assembly, or more specifically, the adhesive 116 disposed between the adhered substrates 102, 104, is subjected to positive pressure, i.e. pressure higher than atmospheric pressure. For instance, the pressure of the chamber 100 is raised to 2 to 6 bars (1 bar is 100,000 Pascal) is pumped into the chamber 100 for a prescribed time ranging from 5 to 30 seconds. This would compress further the size of trapped air bubbles, if any, existing within the adhesive 116 to non-visible sizes with sub-micron dimensions. Step 924 is optional and may be applied if, for any reason e.g. imperfections in chamber design, the trapped air bubbles are not able to be reduced to sizes that are not visible to the naked eye at step 922.

At step 926, the adhesive is cured with an Ultraviolet (UV) light source. This step of curing is may actually be considered a pre-curing step if inspection is required prior to the substrate being subjected to permanent curing. The curing/pre-curing may be conducted while the laminated assembly is in the chamber 100 or at a separate station where all the laminated assemblies ready for pre-curing are transferred to via automated machinery or manually by hand. Pre-curing is done so that the laminated assembly has sufficient strength in the bonding for handling during inspection but not fully bonded so that reworking is still possible should there be a need.

At step 928, the laminated assembly is transferred via automated machinery or manually by hand to another station for inspection or for further or full curing. The step of inspection is optional. Pre-curing at step 926 is optional as well. If pre-curing is skipped, the laminated assembly is transferred directly to a location for full curing at step 932 after step 924. It is appreciated that mention of curing herein could include pre-curing and/or full curing.

At step 930, inspection of the laminated assembly takes place. If any laminated assembly is found to be defective during the inspection, e.g. poor substrate alignment, excessive overflow of adhesive from the substrate edges, visible trapped air bubbles in the adhesive, etc., they could be removed for reworking, i.e. to undergo steps 902 to 926 again.

After inspection at step 930 or step 924, depending on whether the optional inspection step is implemented, at step 932, the laminated assembly is subjected to full curing by a UV light source or by a flood light. The UV light source and/or flood light may be disposed along a moving line conveyor system on which the laminated assembly is placed.

In a laminated assembly where there is a black mask i.e. a coating or fixture of the laminated assembly that prevents the adhesive to be cured because of blockage of UV light, the solution is to provide one or more mirrors arranged at about 45 degrees at the sides of the adhered substrates to direct UV light provided from the top to cure the adhesive located between the substrates from the sides of the adhered substrates. While there is a limit to the distance curable by such a method, the results of the curing are acceptable.

The previous example of the apparatus and method of the present invention as described with reference to FIGS. 1 to 9 are also applicable for curved substrates lamination except that a few modifications may be necessary. Curved substrates lamination is described as follows with reference to FIGS. 12 to 14. The names of some of the elements in FIGS. 1 to 9 are re-used in FIGS. 12 to 14 to indicate the similarity between the present example and the previous example.

Figure 12:
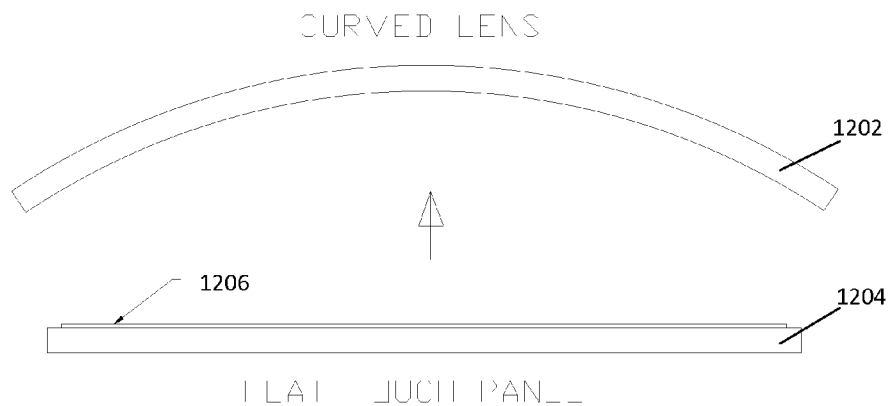
FIG. 12 is a side view of substrates for curved substrate lamination.

With reference to FIG. 12, a curved substrate 1202 to be bonded to substrate 1204 could be, for instance, a clear optical substrate, such as glass or clear plastic lens. Substrate 1204 may of course be of a similar construction. Also, one of the substrate could be, for instance, an Organic Light Emitting Diode (OLED) substrate, a Liquid Crystal Display (LCD) substrate, a Touch Panel, or the like. One of the substrates 1202, 1204 is flat and is deformable into a curved shape. The other substrate 1204 or 1202 has a rigid curved shape for retaining the laminated assembly 1208 in a curved shape. In the present example, the second substrate 1202 is a glass optical lens with a rigid curved shape and the first substrate 1204 is a flat and deformable flat touch panel.

A non-sag adhesive 1206 (or in other words, the adhesive composition of adhesive 1206) similar to adhesive 116 described with reference to FIG. 1 is preferably printed on the first substrate 1204. The method of printing the adhesive 1206 on the first substrate 1204 could be the same as that for printing the adhesive 116 on the first substrate 104 described with reference to FIG. 1.

Figure 13:
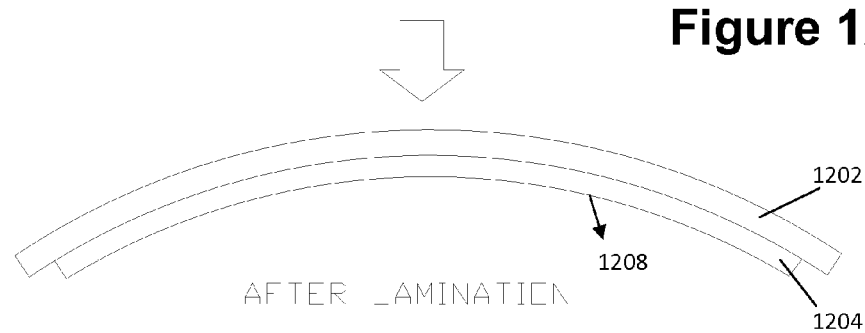
FIG. 13 is a side view of an apparatus for forming a panel substrate assembly.
Figure 13:
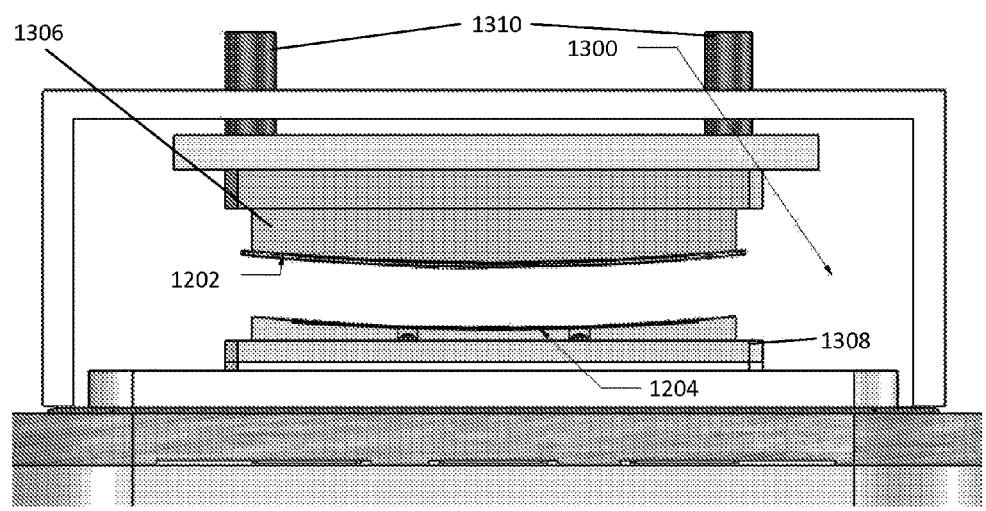

With reference to FIG. 13, bonding of the first and second substrates 1204, 1202 is carried out in a chamber 1300. For curved substrate lamination, the first and second holding mechanisms 1308 and 1306 for holding the first and second substrates 1204, 1202 respectively are curved shape to match the curvature of the second substrate 1202. In the present example, vacuum chucks are used.

Alignment and leveling of the substrates 1202, 1204 can be carried out similarly using side guides and checking of vision marks in the apparatus and method described with reference to FIGS. 1 to 11 and 15.

Similar to the substrates 102, 104 described with reference to FIG. 1, the second substrate 1202 is brought towards the first substrate 1204 by a servo press machine 1310 to a predetermined spacing of 0.025 mm to 2 mm away from the first substrate 1204. Thereafter, the pressure in the chamber 1300 is lowered.

The first holding mechanism 1308 is a vacuum chuck configured to hold the first substrate 1204 in a deformed curved shape until the pressure in the chamber 1300 decreases to around 8000 pa. At around 8000 pa, the first substrate 1204 returns to its original flat form due to the normalization of the holding pressure of the first holding mechanism 1308 with the vacuum environment in the chamber 1300. The second holding mechanism 1306 is a vacuum chuck configured to hold the second substrate 1202 until around 5000 pa.

When the second holding mechanism 1306 loses its hold, the second substrate 1202 will drop down from the second holding mechanism 1306 to contact the adhesive 1206 printed on the first substrate 1204. The distance dropped is predefined to be about 0.025 to 2 mm. At such distance, the adhesive 1206 printed on the first substrate 1204 will not cause any irregularities in the arrangement of the adhesive caused by the dropped second substrate 1202. It is appreciated that if electrostatic chucks are used, there would not be a need to drop the second substrate 1202. In this case, the second substrate 1202 can be brought into contact with the adhesive 1206 spread over on the first substrate 1204.

In the example, after pressure in the chamber 1300 decreases to about 2000 pa, the servo press machine 1310 is moved at low speed, for instance, 0.2 mm/sec to 1 mm/sec, to press the second substrate 1202 onto the adhesive 116 printed on the first substrate 1204. The servo press machine 1310 stops pressing the second substrate 1202 once a predefined distance between the substrates 1202, 1204 is reached. This predefined distance should be sufficient for the adhesive 1206 to have fully flowed to the edges of the substrates 1202, 1204 without overflowing. The predefined distance in the present example is about 0.1 mm. It is appreciated that the range of values of the predefined distance could be 0.025 to 2 mm. The dimensional tolerance of the predefined distance is preferably kept at +/−3 um. The predefined distance can be adjusted to achieve close to 0.1 mm based on the dimensional tolerances of the substrates 1202, 1204 measured at step 918.

After the second substrate 1202 is pressed until a predefined distance is reached between the substrates 1202, 1204. The chamber 1300 increases pressure back to atmospheric pressure to reduce the size of trapped air bubbles in the adhesive 1206, if any. The pressure in the chamber 1300 may be increased further to positive pressure of up to 6 bars to further reduce the size of the trapped air bubbles in the adhesive 1206, if any. This further increase to positive pressure is optional and may be applied if, for any reason e.g. imperfections in chamber design, the trapped air bubbles are not able to be reduced to sizes that are not visible to the naked eye after the chamber 1300 increases pressure back to atmospheric pressure.

UV curing and/or curing by floodlights may take place after the step of increasing the pressure in the chamber 1300 back to normal atmospheric pressure or to positive pressure (i.e. pressure more than normal atmospheric pressure) of up to 6 bars. Curing may also take place during the step of subjecting the laminated product to positive pressure so that trapped air bubbles, if any, in the adhesive 1206 are at their smallest. Curing is preferably done when the bonded substrates 1202, 1204 are in curved shape. Laminated products having a curvature shape with a tendency to spring back into their non-curvature forms should be cured while the substrates are still held together in curved shapes.

Figure 14:
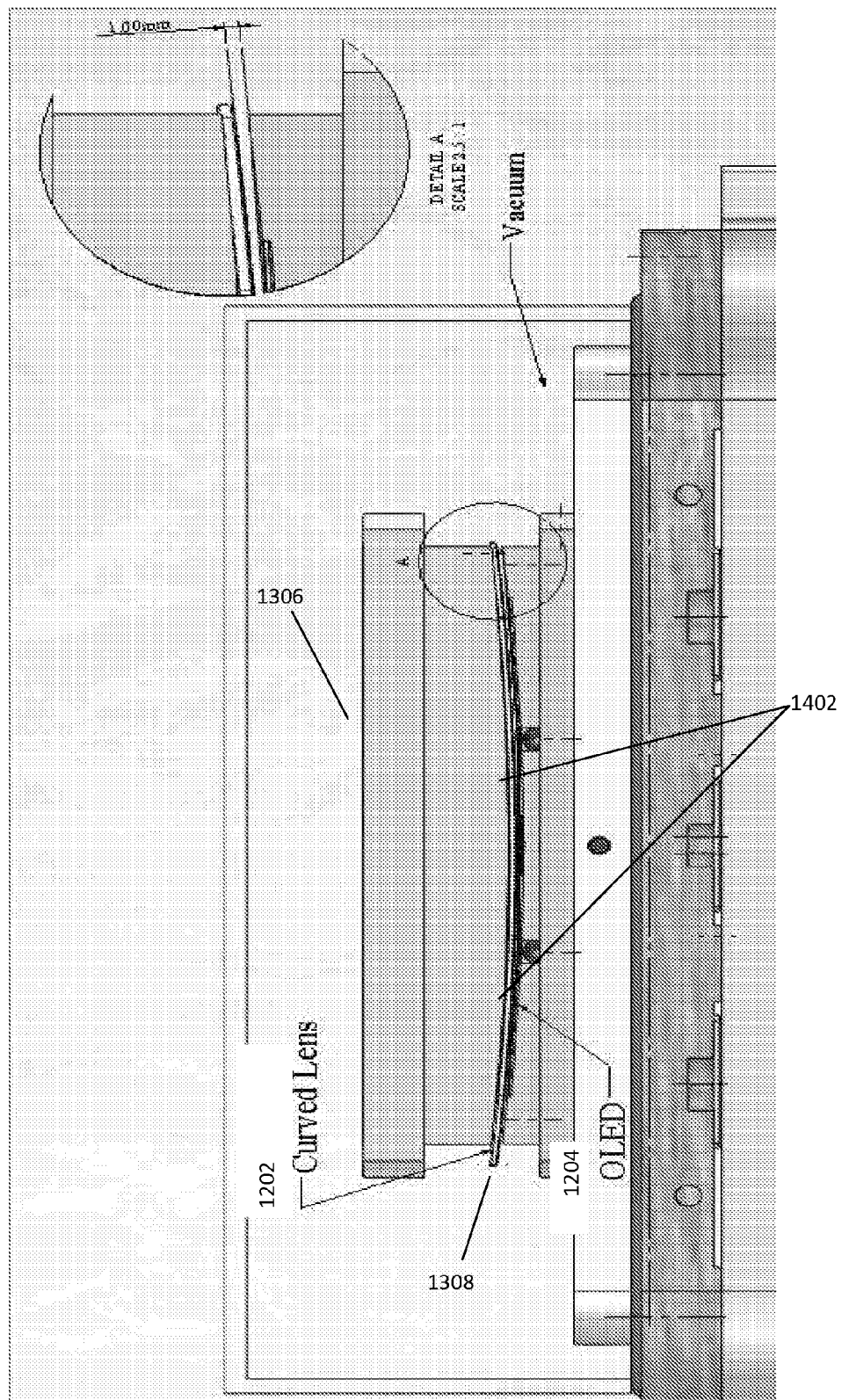
FIG. 14 is a side view of an apparatus for forming a panel substrate assembly.

FIG. 14 illustrates how curing may take place in the chamber 1300. Two light sources 1402 located in the first holding mechanism 1308 emit UV light to cure the curved laminated assembly or product formed by bonding the substrates 1202, 1204.

Examples of the apparatuses and methods for forming a panel substrate assembly described herein may have the following advantages.

The adhesive overflow problem is greatly reduced because adjustments to align substrates for lamination are derived via a "closed loop" method. "Closed loop" means that the apparatuses have a feedback system. With reference to the example described with reference to FIG. 9, the feedback is the dimensional tolerances of each substrate determined at steps 912 and 918. The feedback data of the dimensional tolerances of the substrates to be laminated helps to derive data required for making adjustments in the axes, which the substrates are moved along to laminate them together (i.e. Z axis in FIG. 11). The adjustment of the predefined distance described herein is one such adjustment in the Z axis. The dimensional tolerances also help to drive data required for angular adjustments i.e. pitch and roll of the substrate (104 in FIG. 1) before the lamination process takes place (FIG. 11 and accompanying description). The non-sag nature of the adhesive (adhesive 116 in FIG. 1) used also contributes to limiting the extent of overflow of the adhesive.

Adhesive (116 in FIG. 1) on the substrate (104 in FIG. 1) is applied via a printing method, which aids even spreading of the adhesive, thereby ensuring good adhesive thickness tolerances. Examples of good adhesive thickness tolerances would be +/−20 um and below. Designing the stencil used for the printing method to have one or more ribs (206 in FIGS. 2 and 3) helps to prevent scooping effect for large area prints and to ensure even spread of the adhesive across the whole print area.

Figure 9:
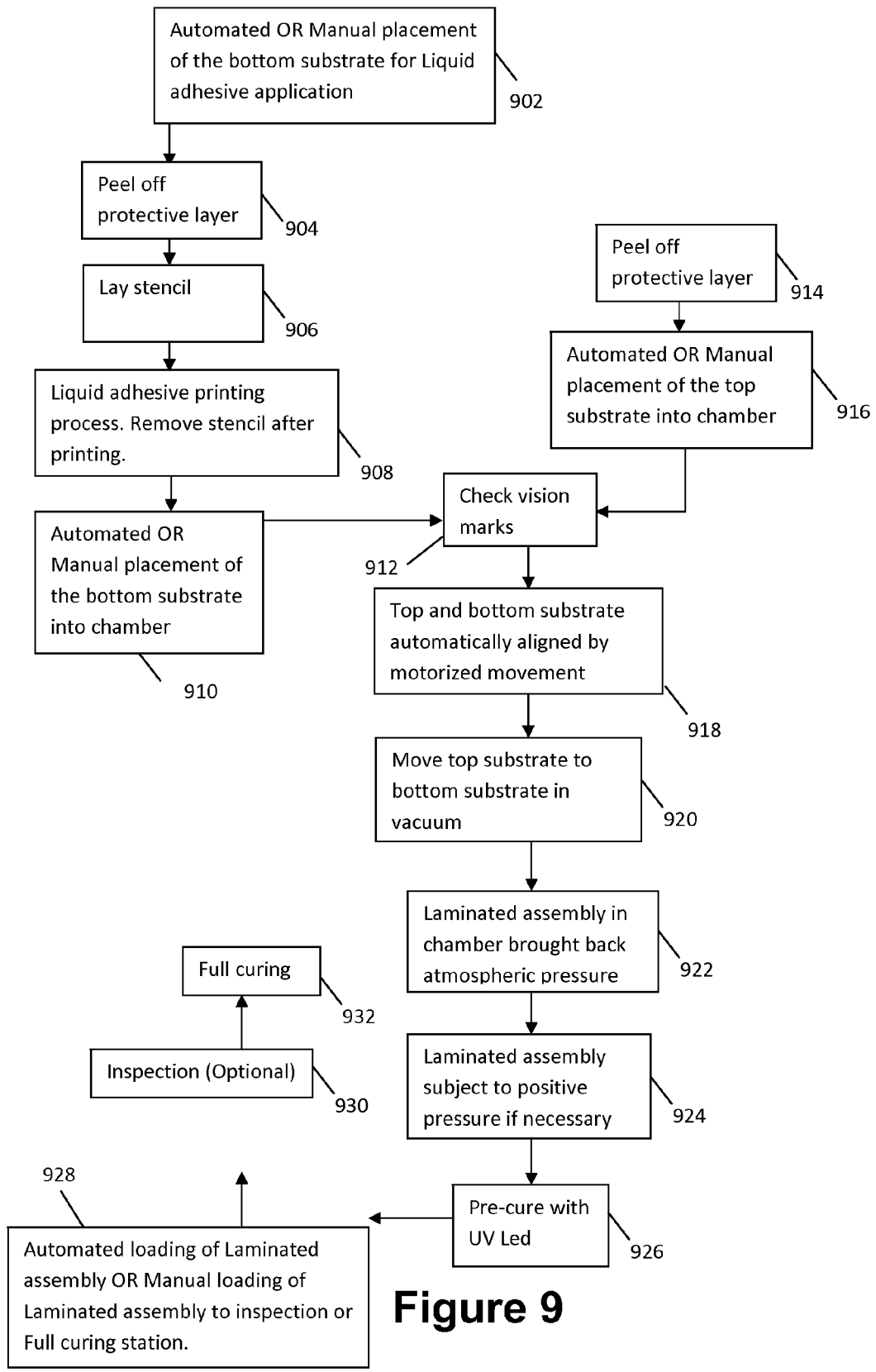
FIG. 9 is a flowchart of a method for forming a panel substrate assembly.

Lamination is performed in an environment having a lower than atmospheric pressure ranging from 0 to 5000 Pa to make the air pressure of air bubbles trapped in the adhesive (116 in FIG. 1), if any, correspondingly lower than atmospheric pressure (step 920 of FIG. 9). That may help to keep any bubbles which are trapped in the adhesive as small as possible, preferably non-visible to the naked eye after the surrounding pressure of the substrate is brought back to normal atmospheric pressure (step 922 of FIG. 9). Furthermore, after the step of lamination under vacuum environment, the laminated assembly may be subjected to pressure higher than normal atmospheric pressure to shrink any bubbles further in an effort to ensure they are non-visible (step 924 of FIG. 9). Curing of the adhesive (116 in FIG. 1) may be done in the pressurized environment to ensure the adhesive is cured to the form where the trapped air bubbles are at their smallest size.

The lamination time for forming a display panel using the method described with reference to FIG. 9 and the similar method for curved substrates described with reference to FIGS. 12 to 14 is about 10 to 90 seconds for a display panel with size of 27 inches or less (diagonally) depending on the size of substrate. It is appreciated that this is substantially faster than previous known lamination methods.

Selective area adhesive lamination is possible because of the non-sag property of the adhesive (116 in FIG. 1). As the adhesive does not flow easily, it can stay in the shape in which it is formed, applied or printed. This makes precise adhesive application on specific areas possible. Thus, problems which might otherwise be caused by adhesive flowing into areas which are deliberately blocked out may be reduced. For instance, in the case of lamination of cover panels of a mobile device, areas for placement of cameras, speakers and microphones would be blocked out to prevent adhesive (116 in FIG. 1) from reaching those areas.

Furthermore, the non-sag property of the adhesive (1206 in FIG. 12) makes curved substrate lamination possible via methods such as the one described with reference to FIGS. 12 to 14. If the adhesive (1206 in FIG. 12) is prone to flow, there is high tendency that the adhesive (1206 in FIG. 12) would flow over the curved contours of the substrates as a result of gravity pull.

Many modifications and other embodiments can be made to the method and apparatus for forming a panel substrate assembly by those skilled in the art having the understanding of the above described disclosure together with the drawings. Therefore, it is to be understood that the method and apparatus for forming a panel substrate assembly is not to be limited to the above description contained herein only, and that possible modifications are to be included in the claims of the disclosure.

The invention claimed is:

1. An apparatus for forming a display panel substrate assembly, the substrate assembly comprising a first substrate and a second substrate, at least one of the first substrate and the second substrate being optically clear, the apparatus comprising:
    a printing device for applying a non-sag adhesive composition comprising a thixotropic material onto a surface of the first substrate, the non-sag adhesive composition being characterized in that it has a viscosity of between about 5 and about 20 Pa·s at 25° C. and at a shear rate of 1 to 10 sec$^{-1}$ and a viscosity of at least 700 Pa·s at 25° C. and at a shear rate of 0.01 sec$^{-1}$, the non-sag adhesive composition further being of a type which is optically clear after curing, wherein the printing device comprises a stencil comprising one or more ribs extending in a printing area from a first side of the stencil to a second side of the stencil, wherein each rib comprises first end at the first side, a second end at the second side, an apex located between the first and second ends, and a side having a tapered portion and wherein each rib tapers from the first end at the first side or the second end at the second side of the stencil towards the apex of the rib between the first side and the second side such that a width of the rib is thinnest at the apex;
    a chamber for the non-sag adhesive composition to be brought into contact with a surface of the second substrate therein at a pressure less than or equal to 5000 pascals; and
    a curing device for curing the non-sag adhesive composition to yield an adhesive layer.

2. The apparatus of claim 1, wherein the apparatus comprises a plurality of side guides movable towards the first substrate from opposite sides of the first substrate to push the first substrate into position facing the surface of the second substrate prior to bringing the non-sag adhesive composition into contact with the surface of the second substrate.

3. The apparatus of claim 1, wherein the apparatus comprises adjustable holding mechanisms for holding the first substrate and the second substrate, the holding mechanism for the first substrate being adjustable to tilt the first substrate such that the first substrate and the second substrate are aligned prior to bringing the non-sag adhesive composition into contact with the surface of the second substrate.

4. The apparatus of claim 1, wherein the curing device comprises a mirror for directing light from a curing source towards the non-sag adhesive composition exposed between the first substrate and the second substrate after the non-sag adhesive composition is placed into contact with the surface of the second substrate.

5. The apparatus of claim 1, wherein the printing area has a corner area, the corner area having a cut-away portion.

* * * * *

UNITED STATES PATENT AND TRADEMARK OFFICE
CERTIFICATE OF CORRECTION

PATENT NO.         : 9,889,461 B2                                Page 1 of 1
APPLICATION NO.    : 13/821590
DATED              : February 13, 2018
INVENTOR(S)        : Busman et al.

It is certified that error appears in the above-identified patent and that said Letters Patent is hereby corrected as shown below:

In the Specification

<u>Column 4</u>
Line 17, delete "minor" and insert -- mirror --, therefor.

<u>Column 25</u>
Lines 39-40, delete "At step 914, a protective layer 116 of the second substrate 102 is peeled off." and insert the same on Column 25, Line 41 as a new paragraph.

Signed and Sealed this
Fourteenth Day of August, 2018

Andrei Iancu
*Director of the United States Patent and Trademark Office*